(12) United States Patent
Lu et al.

(10) Patent No.: US 11,810,793 B2
(45) Date of Patent: Nov. 7, 2023

(54) SEMICONDUCTOR PACKAGES AND METHODS OF FORMING SAME

(71) Applicant: Taiwan Semiconductor Manufacturing Co., Ltd., Hsinchu (TW)

(72) Inventors: Chung-Yu Lu, Hsinchu (TW); Ping-Kang Huang, Chiayi (TW); Sao-Ling Chiu, Hsinchu (TW); Shang-Yun Hou, Jubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/873,640

(22) Filed: Jul. 26, 2022

(65) Prior Publication Data

US 2022/0367208 A1    Nov. 17, 2022

Related U.S. Application Data

(63) Continuation of application No. 17/065,265, filed on Oct. 7, 2020, now Pat. No. 11,495,472.

(Continued)

(51) Int. Cl.
| | | |
|---|---|---|
| *H01L 21/48* | (2006.01) | |
| *H01L 23/00* | (2006.01) | |
| *H01L 23/538* | (2006.01) | |
| *H01L 25/065* | (2023.01) | |
| *H01L 25/18* | (2023.01) | |

(Continued)

(52) U.S. Cl.
CPC .......... *H01L 21/486* (2013.01); *H01L 21/481* (2013.01); *H01L 21/4853* (2013.01); *H01L 23/49827* (2013.01); *H01L 23/5384* (2013.01); *H01L 24/81* (2013.01); *H01L 25/0655* (2013.01); *H01L 25/18* (2013.01); *H01L 25/50* (2013.01); *H01L 21/563* (2013.01);

(Continued)

(58) Field of Classification Search
CPC .. H01L 21/486; H01L 21/481; H01L 21/4853
See application file for complete search history.

(56) References Cited

U.S. PATENT DOCUMENTS

| | | |
|---|---|---|
| 2011/0210444 A1 | 9/2011 | Jeng et al. |
| 2012/0133041 A1 | 5/2012 | Phee et al. |

(Continued)

FOREIGN PATENT DOCUMENTS

KR    20120057289 A    6/2012

*Primary Examiner* — Errol V Fernandes
(74) *Attorney, Agent, or Firm* — Slater Matsil, LLP

(57) ABSTRACT

One embodiment includes partially forming a first through via in a substrate of an interposer, the first through via extending into a first side of the substrate of the interposer. The method also includes bonding a first die to the first side of the substrate of the interposer. The method also includes recessing a second side of the substrate of the interposer to expose the first through via, the first through via protruding from the second side of the substrate of the interposer, where after the recessing, the substrate of the interposer is less than 50 μm thick. The method also includes and forming a first set of conductive bumps on the second side of the substrate of the interposer, at least one of the first set of conductive bumps being electrically coupled to the exposed first through via.

20 Claims, 31 Drawing Sheets

Related U.S. Application Data

(60) Provisional application No. 63/010,846, filed on Apr. 16, 2020.

(51) Int. Cl.
*H01L 25/00* (2006.01)
*H01L 23/498* (2006.01)
*H01L 21/56* (2006.01)

(52) U.S. Cl.
CPC .................. *H01L 23/49894* (2013.01); *H01L 2224/81815* (2013.01)

(56) References Cited

U.S. PATENT DOCUMENTS

2018/0138101 A1* 5/2018 Yu ........................ H01L 23/481
2019/0067104 A1 2/2019 Huang et al.

\* cited by examiner

SEMICONDUCTOR PACKAGES AND METHODS OF FORMING SAME

PRIORITY CLAIM AND CROSS-REFERENCE

This application is a continuation of U.S. patent application Ser. No. 17/065,265, filed Oct. 7, 2020, entitled "Semiconductor Packages and Methods of Forming Same," which claims the benefit of U.S. Provisional Application No. 63/010,846, filed on Apr. 16, 2020, which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Accordingly, interposers have been used to redistribute ball contact areas from that of the chip to a larger area of the interposer. Further, interposers have allowed for a three-dimensional (3D) package that includes multiple chips.

Despite the benefits of using an interposer to allow for a reduced size of the chip, using an interposer typically has drawbacks. Interposers generally introduce new sets of problems that go undetected until processing is completed. Thus, packages having faulty interposers may undergo processing that is unnecessary because a defect in earlier processing rendered the interposers unusable. Some of these problems generally include voids in a through substrate via (TSV), abnormal routing of a metallization layer after an etch process, a bump cold joint (open or short circuit), and a crack in an interposer ball.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
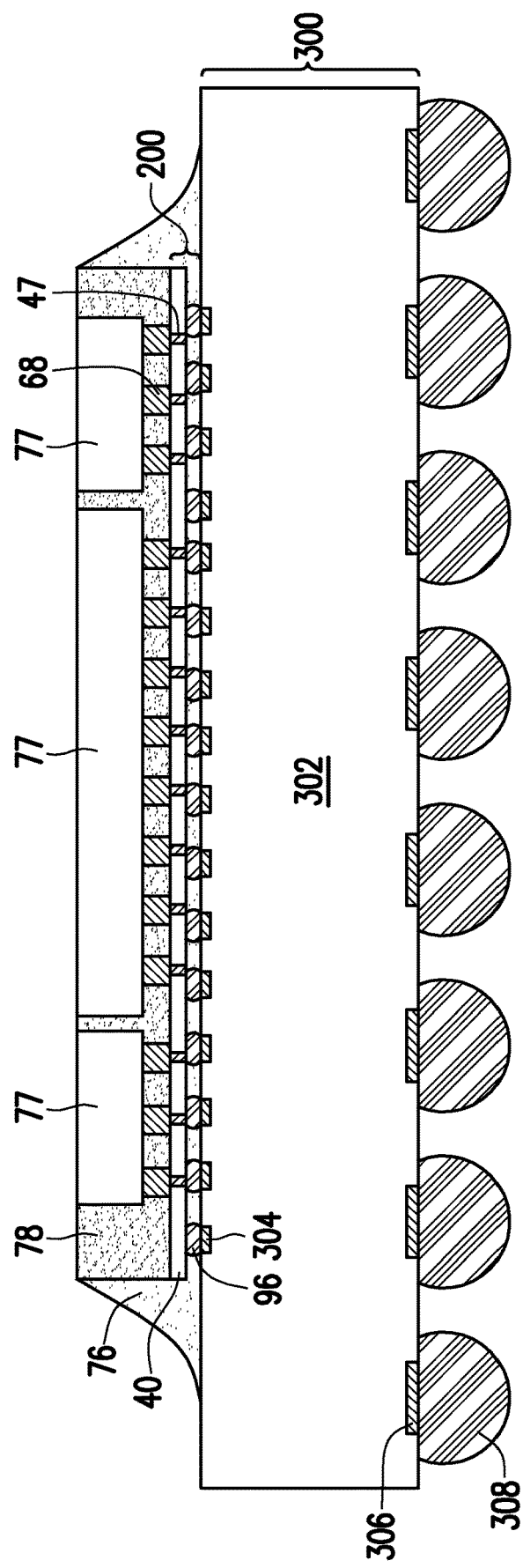
FIG. 1 is a cross-sectional view of a package structure including an interposer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the device package may include one or more semiconductor chips bonded to an interposer with the interposer being bonded to a substrate. The interposer provides electrical routing between the one or more semiconductor chips and the package substrate. For example, the interposer may include a redistribution structure (e.g., comprising conductive lines and/or vias disposed in one or more insulating layers) disposed on a substrate. The redistribution structure provides electrical routing to/from the one or more semiconductor chips. Conductive vias may extend through the substrate and are electrically connected to the conductive features of the redistribution structure. In some embodiments, solder regions are disposed on the conductive vias to provide electrical connectors (e.g., microbumps (µbumps)) for bonding to the package substrate.

In order to achieve a small package profile and to improve the performance of the package, the substrate of the interposer has a thickness in a range from 1 µm to 50 µm. In some embodiments, the substrate of the interposer is less than 50 µm thick. Due to the thinness of the substrate, the substrate is more flexible and can reduce the stress in the package during thermal processing of the device package (e.g., reliability/stress testing, reflow/bonding to the package substrate, and the like). Further, the resistance, inductance, and capacitance of the through vias in the interposer is improved over through vias in thicker interposers. In some embodiments, the ratio of the thickness of the chip to the thickness of the substrate of the interposer is in a range from 10 to 50. In other words, the chip is 10 to 50 times thicker than the substrate of the interposer. In other embodiments, the ratio of the thickness of the substrate of the chip to the thickness of the substrate of the interposer can be smaller than 10 or larger than 50.

Various embodiments also provide a buffer structure between the interposer and the package substrate to further improve the reliability of the package and reduce the stress on the substrate of the interposer and the semiconductor chips. In some embodiments, the buffer structure may include one or more polymer layers, such as a polyimide. Further, the buffer structure may include a polymer layer with a Young's modulus in a range from 1 gigapascal (GPa) to 10 GPa. Because of the low Young's modulus value, the buffer structure is flexible and can deform with cracking or breaking.

Embodiments will be described with respect to a specific context, namely a Die-Interposer-Substrate stacked package. Other embodiments may also be applied, however, to other packages, such as a Die-Die-Substrate stacked package. Embodiments discussed herein are to provide examples to enable making or using the subject matter of this disclosure, and a person having ordinary skill in the art will readily understand modifications that can be made while remaining within contemplated scopes of different embodiments Like reference numbers and characters in the figures below refer to like components. Although method embodiments may be discussed as being performed in a particular order, other method embodiments may be performed in any logical order.

FIG. 1 illustrates a cross-sectional view of a package structure. FIG. 1 shows a cross section view of an interposer 200 with integrated circuit dies 77 attached to a first side of the interposer 200 via conductive connectors 68. The integrated circuit dies 77 include an interconnect that comprises one or more metallization layers.

The interposer 200 includes a substrate 40, through substrate vias (TSVs, also known as through-silicon vias or through-semiconductor vias) 47. The interposer 200 comprises a redistribution structure comprising one or more metallization layer. The conductive connectors 68 are electrically coupled to the TSVs 47 in the interposer 200 via the one or more metallization layers in the redistribution structure. The TSVs 47 extend through a substrate 40 of the interposer 200 from a front side of the substrate on which the redistribution structure is formed to a back side of the substrate 40.

The substrate 40 of the interposer 200 has a thickness in a range from 1 µm to 50 µm. In some embodiments, the ratio of the thickness of the substrate of the chip to the thickness of the substrate of the interposer is in a range from 10 to 50. In other embodiments, the ratio of the thickness of the substrate of the chip to the thickness of the substrate of the interposer can be smaller than 10 or larger than 50.

The interposer 200 comprises a passivation structure which may include one or more metallization layers, such as a back side redistribution element. Conductive pads are mechanically coupled to the back side of the interposer 200 and are electrically coupled to the TSVs 47 directly and/or via the one or more metallization layers in the passivation structure. Conductive connectors 96 are mechanically and electrically coupled to the conductive pads. The conductive connectors 96 provide external electrical connections from the integrated circuit dies 77. The conductive connectors 96 are mechanically coupled to the package substrate 300 and electrically coupled to conductive pads 304 on the package substrate 300.

The package substrate 300 includes a substrate 302, conductive pads 304 facing the interposer 200, and conductive pads 306 facing away from the interposer 200. Conductive connectors 308 are mechanically and electrically coupled to the conductive pads 306. The package substrate 300 may be a core substrate with through vias and redistribution structures on both sides of the core and coupled to the through vias.

Figure 2:
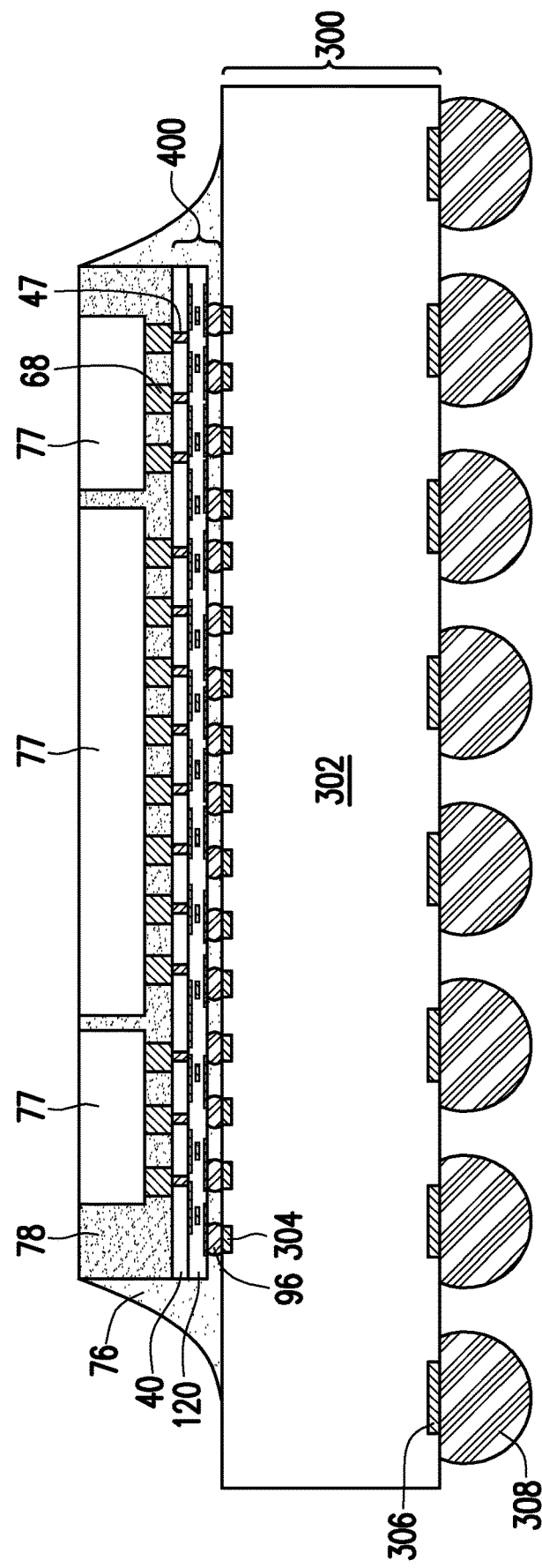
FIG. 2 is a cross-sectional view of a package structure including an interposer in accordance with some embodiments.

FIG. 2 illustrates a cross-sectional view of an interposer 400 that includes a buffer structure 120. The embodiment in FIG. 2 is similar to the embodiment in FIG. 1 except that the interposer 400 includes a buffer structure 120. The buffer structure 120 includes one or more polymer layers, such as polyimide layers, that reduces the stress in the package structure.

FIGS. 3 through 25 illustrate a method of forming an interposer 200 with an intermediate layer and a die attached to the interposer, such as the structure illustrated in FIG. 1. It should be appreciated that this order is provided for illustrative purposes, and that other sequences may be used.

Figure 3:
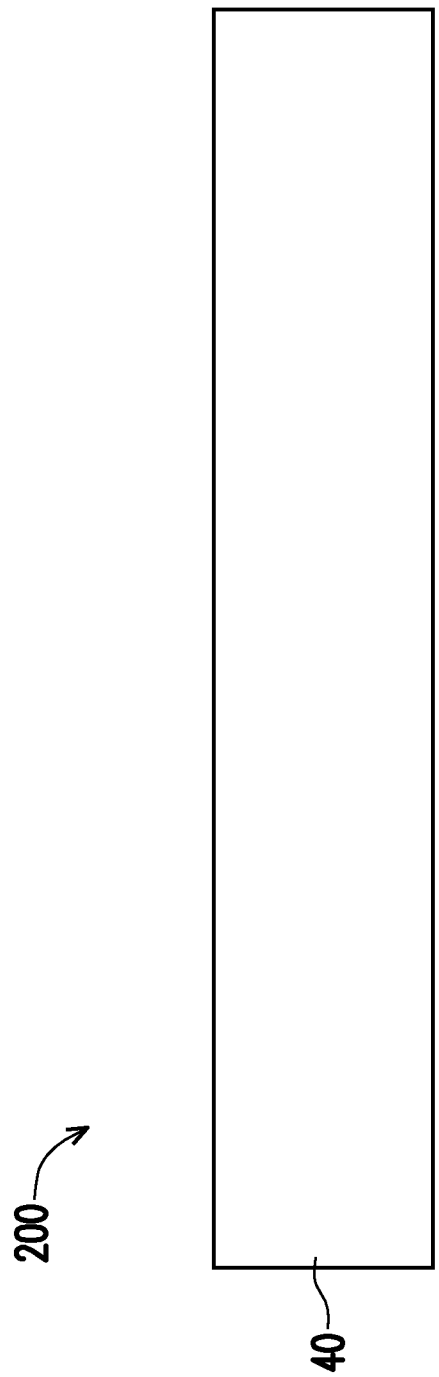
FIGS. 3 through 24 illustrate various intermediate stages in the fabrication of a package structure including an interposer in accordance with some embodiments.

FIGS. 3 through 12 illustrate the formation of the interposer 200. Referring first to FIG. 3, a substrate 40 of an interposer is provided. The substrate 40 generally comprises a material similar to the substrate used to form an integrated circuit die that will be attached to the interposer, such as silicon. The substrate 40 can be a wafer. The substrate 40 may comprise a bulk semiconductor substrate, semiconductor-on-insulator (SOI) substrate, multi-layered semiconductor substrate, or the like. The semiconductor material of the substrate 40 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 40 may be doped or undoped. Devices, such as transistors, capacitors, resistors, diodes, and the like, may be formed in and/or on an upper surface of the substrate 40, which may also be referred to as an active surface, of the substrate. While the substrate 40 may be formed of other materials, it is believed that using silicon substrates for the interposer may reduce stress because the coefficient of thermal expansion (CTE) mismatch between the silicon substrates and the silicon typically used for the dies is lower than with substrates formed of different materials.

Figure 4:
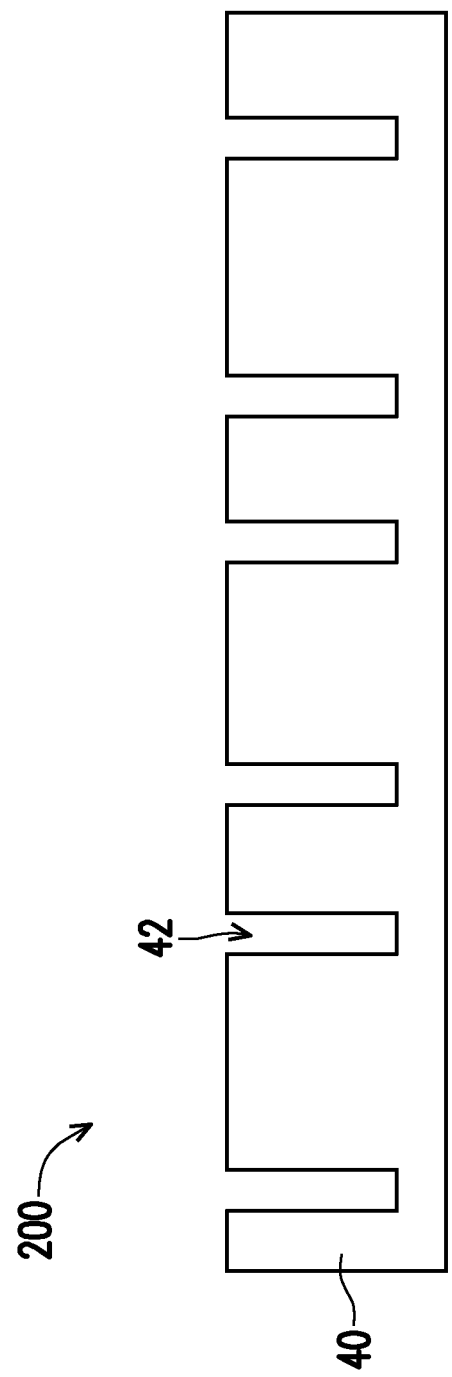

In FIG. 4, recesses 42 are formed partially through the substrate 40. Through substrate vias will subsequently be formed in the recesses 42. The recesses 42 may formed by etching, milling, laser techniques, a combination thereof, or the like. The recesses 42 into the substrate 40 may be formed using, for example, a combination of photolithography and etching. For example, a photoresist (not illustrated) may be deposited over the substrate 40 by spinning, or the like. After deposition, the photoresist is then patterned, for example, by placing a patterned photomask over the photoresist, exposing portions of the photoresist using the photomask, and developing the photoresist to remove either exposed or unexposed portions of the photoresist (depending on whether a positive tone or negative tone resist is used). The pattern of the photoresist corresponds to the pattern of the recesses 42. The substrate 40 is then etched using the photoresist as a mask. The type of etching process may depend on a material of the substrate 40. For example, to etch the substrate 40, a dry etching process may be used. Example etchants for a dry etching process include $SF_6$ or the like.

Figure 5:
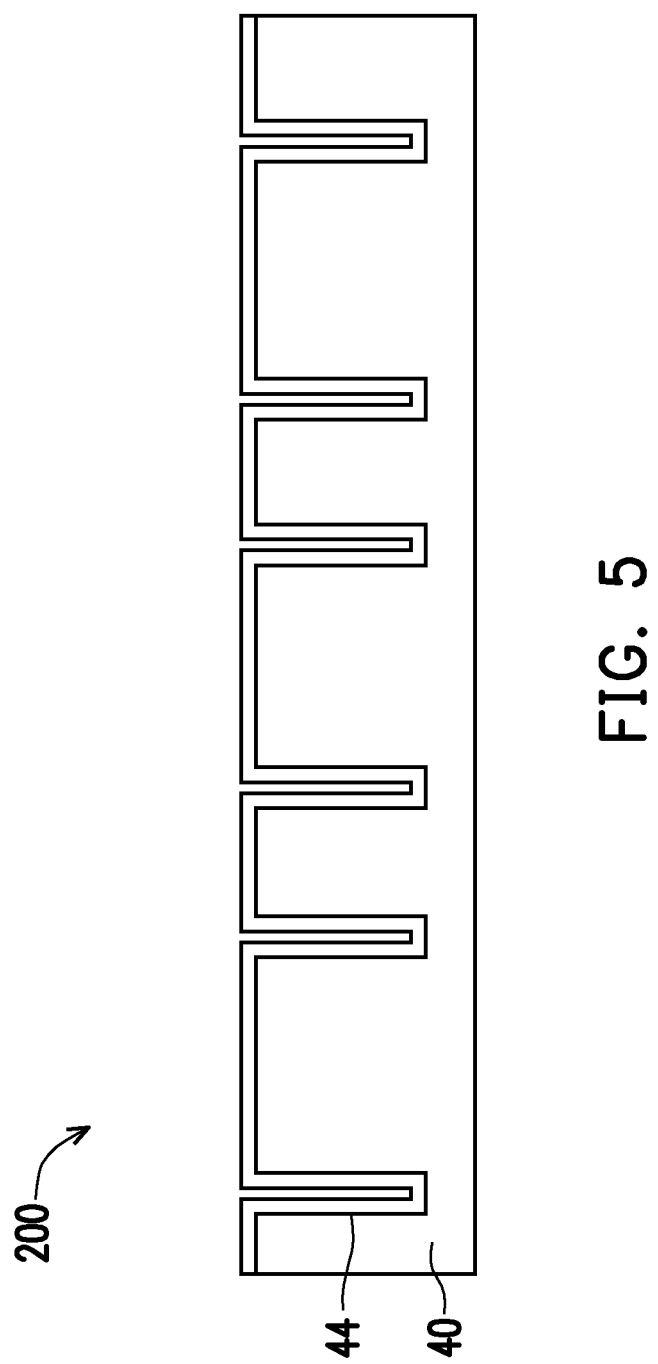

In FIG. 5, a barrier layer 44 is conformally deposited over the front side of the substrate 40 and in the recesses 42. The barrier layer 44 may be formed of a nitride or an oxynitride, such as titanium nitride, titanium oxynitride, tantalum nitride, tantalum oxynitride, a combination thereof, or the like. In some embodiments, the barrier layer 44 is formed by chemical vapor deposition (CVD), atomic layer deposition (ALD), physical vapor deposition (PVD), thermal oxidation, a combination thereof, or the like.

Figure 6:
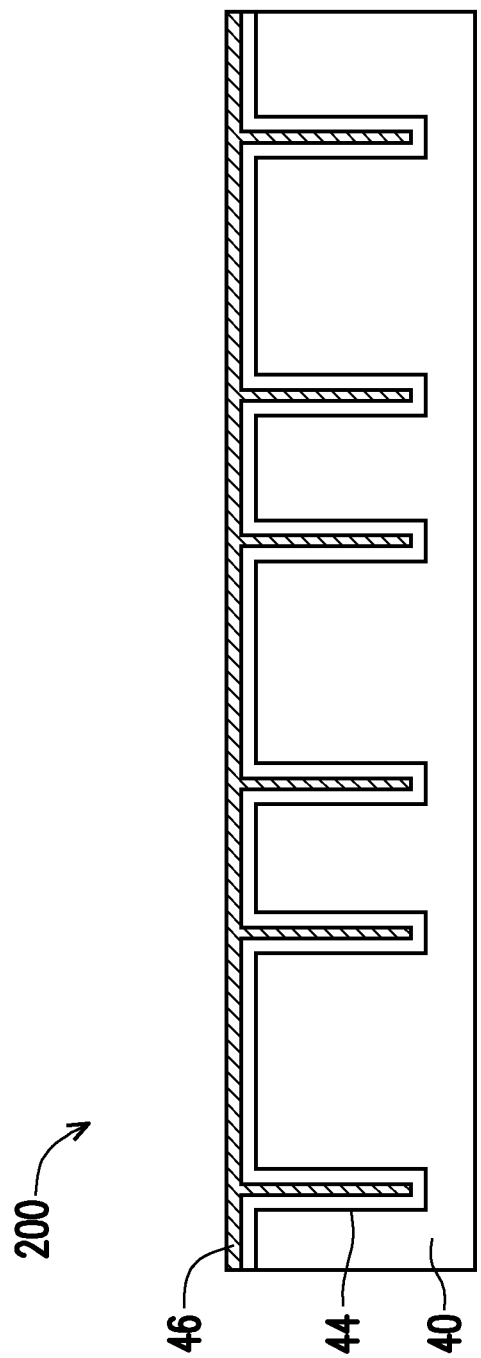

In FIG. 6, a conductive material 46 is deposited over the thin barrier layer and in the openings. The conductive material 46 may be formed by an electro-chemical plating process, CVD, ALD, PVD, a combination thereof, or the like. Examples of conductive materials 46 are copper, tungsten, aluminum, silver, gold, a combination thereof, and/or the like.

Figure 7:
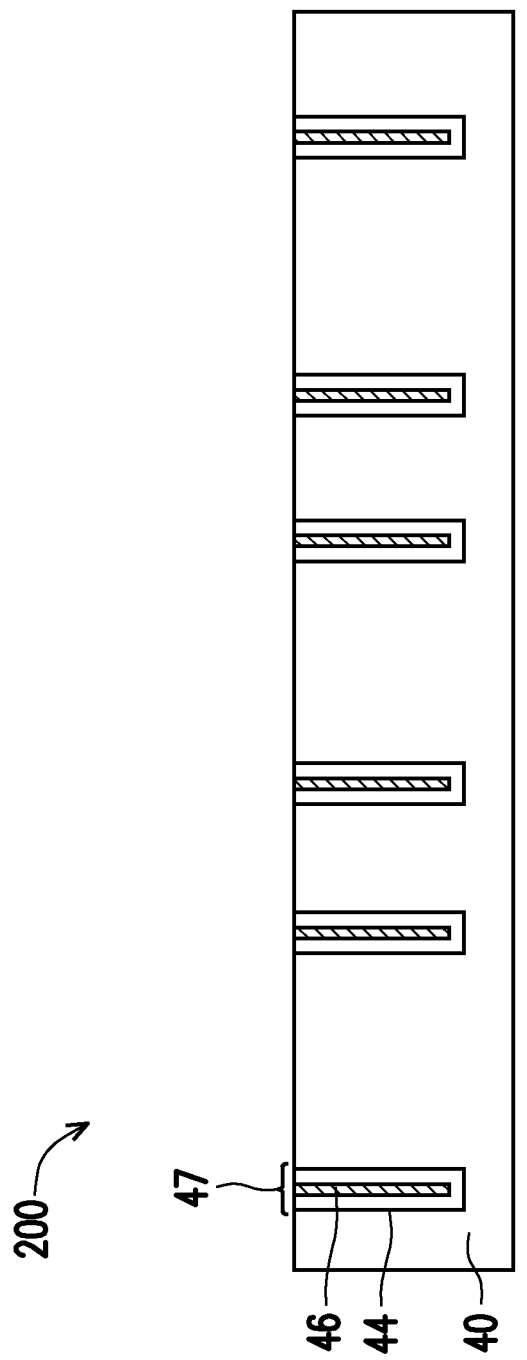

In FIG. 7, excess conductive material 46 and barrier layer 44 is removed from the front side of the substrate 40 by, for example, chemical mechanical polishing (CMP), forming TSVs 47. After the CMP, surfaces of the conductive material 46, the barrier layer 44, and the substrate 40 are coplanar (within process variation). Thus, the TSVs 47 comprise a conductive material 46 and a barrier layer 44 between the conductive material 46 and the substrate 40.

Figure 8:
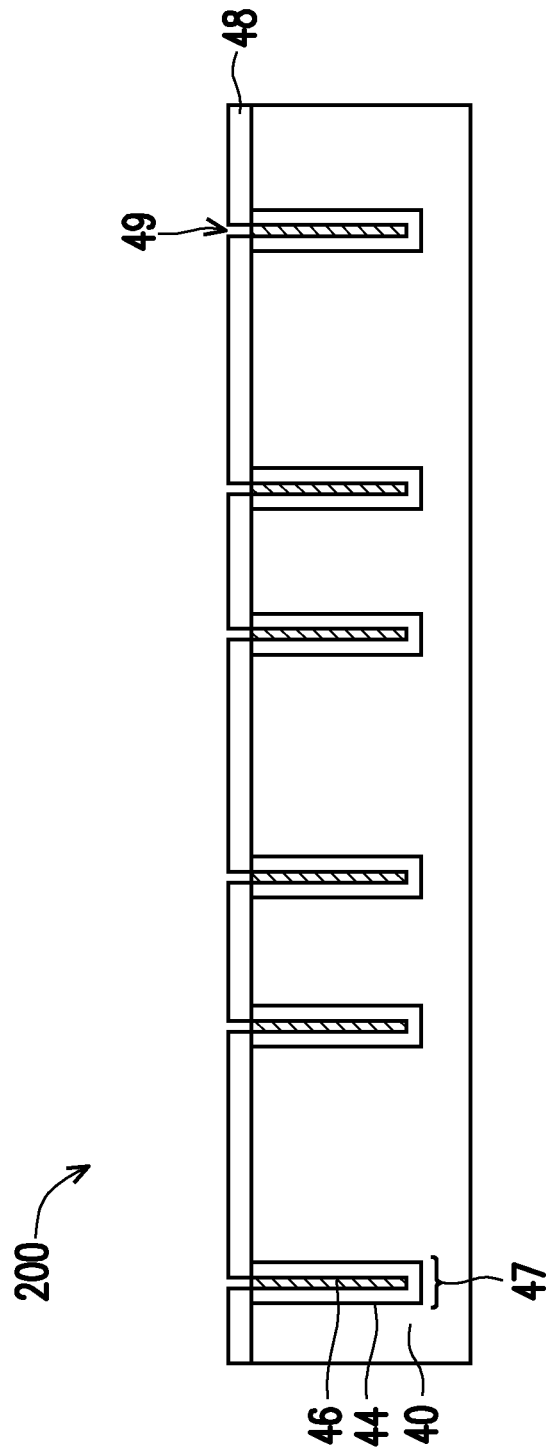
Figure 9:
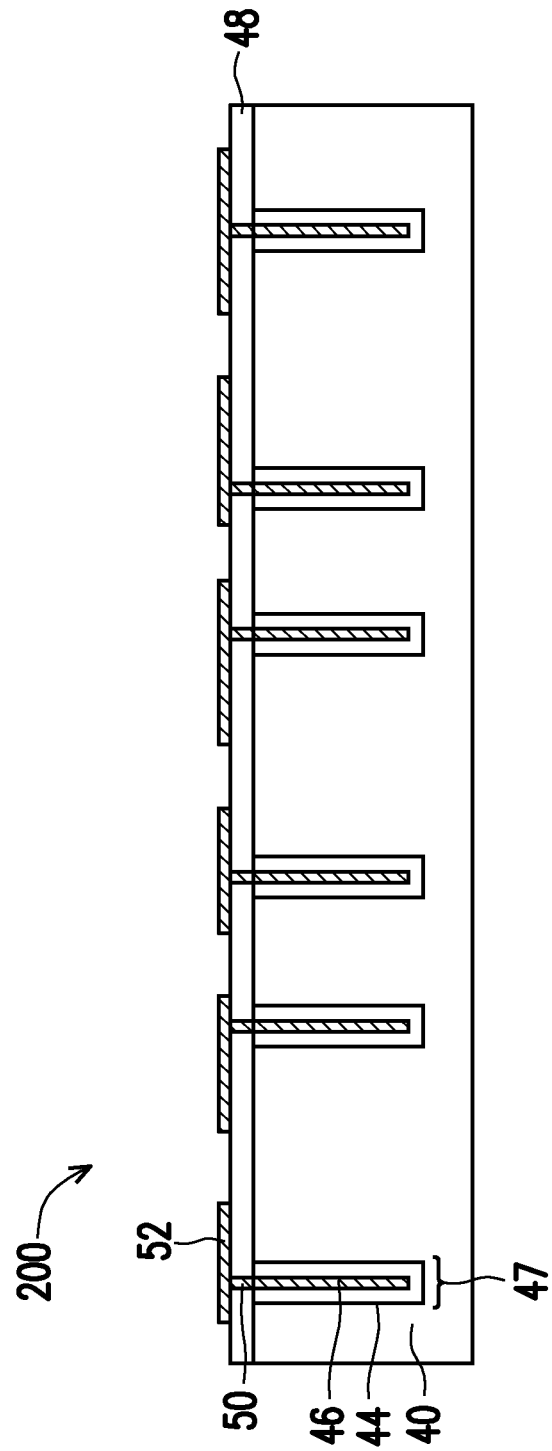
Figure 10:
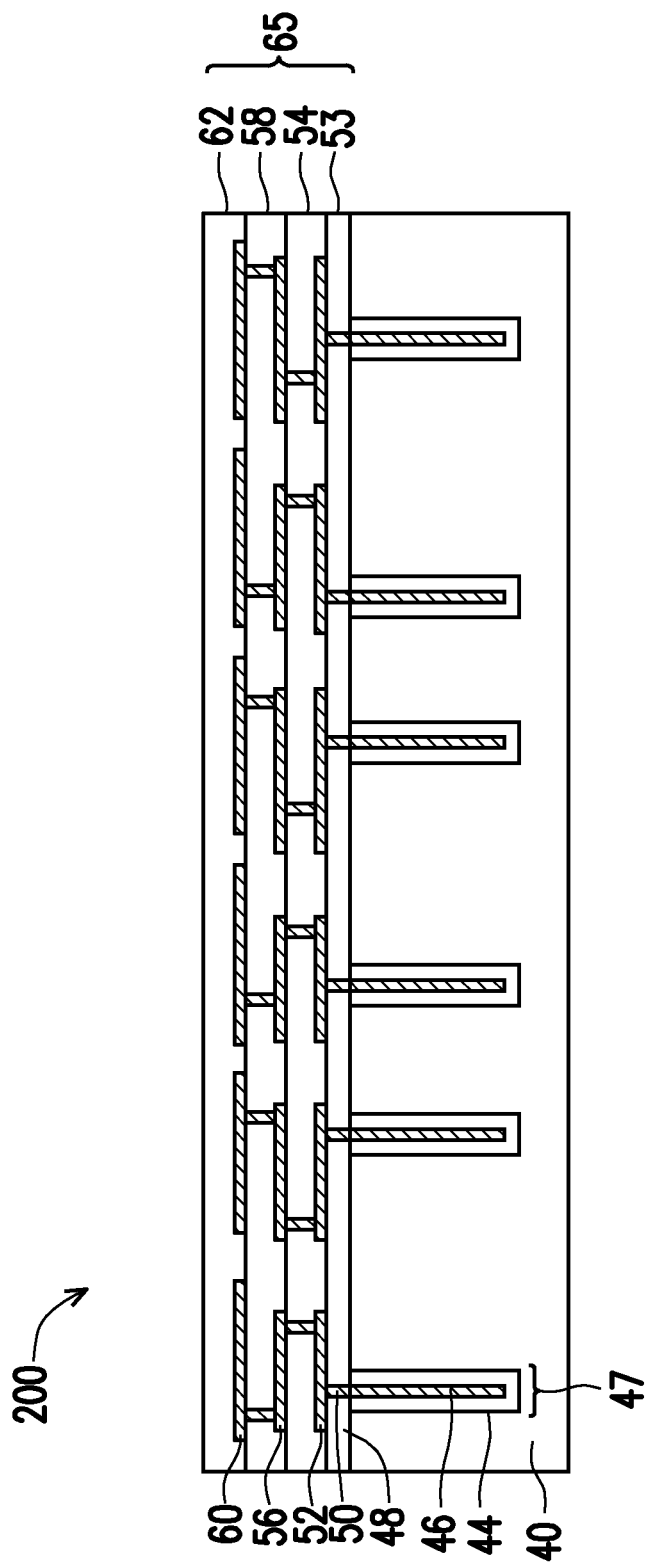

FIGS. 8 through 10 illustrate the formation of a redistribution structure 65. The redistribution structure 65 is formed on the front side of substrate 40, and is used to electrically connect the integrated circuit devices, if any and/or to external devices, such as the subsequently attached semiconductor chips. The redistribution structure 65 may include one or more dielectric layer(s) and respective metallization pattern(s) in the dielectric layer(s). The metallization patterns may comprise vias and/or traces to interconnect any devices and/or to an external device. The metallization patterns are sometimes referred to as Redistribution Lines (RDL).

In FIG. 8, a dielectric layer 48 (sometimes referred to as an inter-metal dielectric (IMD) layer 48) is deposited over the substrate 40 and the TSVs 47. The dielectric layer 48 may comprise silicon oxide, silicon nitride, silicon carbide, silicon oxynitride, low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, plasma-enhanced CVD (PECVD), high-density plasma chemical vapor deposition (HDP-CVD), the like, or a combination thereof.

Openings 49 are etched in the IMD layer 48 to expose the conductive material 46 of the TSVs 47. The openings 49 may be formed using, for example, acceptable photolithography and etching techniques. The openings 49 will become the openings for subsequently formed vias to the TSVs 47.

In FIG. 9, a metallization pattern including conductive vias 50 and conductive lines 52 are formed in the openings 49 and over the dielectric layer 48. The metallization pattern includes conductive elements 52 extending along the major surface of the dielectric layer 48 and elements 50 extending through the dielectric layer 48 to physically and electrically coupled to the TSVs 47. As an example to form the metallization pattern, a seed layer (not shown) is formed over the dielectric layer 48 and in the openings 49 extending through the dielectric layer 48. A photoresist (not shown) is then formed and patterned on the seed layer. The patterning forms openings through the photoresist to expose the seed layer, with the pattern of the openings corresponding to the metallization pattern. A conductive material is then formed in the openings of the photoresist and on the exposed portions of the seed layer. The conductive material may be formed by plating, such as electroplating or electroless plating, CVD, PVD, or the like. The conductive material may comprise a metal, like copper, nickel, aluminum, copper aluminum, tungsten, titanium, combinations thereof, or the like. The combination of the conductive material and underlying portions of the seed layer form the metallization pattern. The photoresist and portions of the seed layer on which the conductive material is not formed are removed. Once the photoresist is removed, exposed portions of the seed layer are removed, such as by using an acceptable etching process, such as by wet or dry etching. The combination of the dielectric layer 48 and the metallization pattern 50 and 52 form the redistribution layer 53.

In FIG. 10, the steps and process in discussed above in FIGS. 8 and 9 are repeated to form additionally shown redistribution layers 54, 58, and 62 in redistribution structure 65. In some embodiments, the process described above to form the redistribution structure 65 may be repeated one or more times to provide additional routing layers as desired for a particular design. Four redistribution layers 53, 54, 58, and 62 are shown for illustrative purposes. In some embodiments more or less than four may be used. The metallization patterns 52, 56, and 60 for each redistribution layer 53, 54, 58, and 62, respectively may have separately formed conductive lines and conductive vias (as shown), or may each be a single pattern having line and via portions.

The metallization patterns may include barrier layers, such as one or more layers of TaN, Ta, TiN, Ti, CoW, between the conductive material and the dielectric layers, and may include other dielectric layers, such as etch stop layers made of, for example, silicon nitride, may be formed between the dielectric layers.

After the formation of the top metallization pattern, the metallization pattern 60 in FIG. 10, one or more passivation layers are formed over the metallization layers. The passivation layer(s) may be a polyimide, a BPSG, a combination thereof, or the like, and may be formed using a spin-on technique, CVD, ALD, a combination thereof, or the like.

Figure 11:
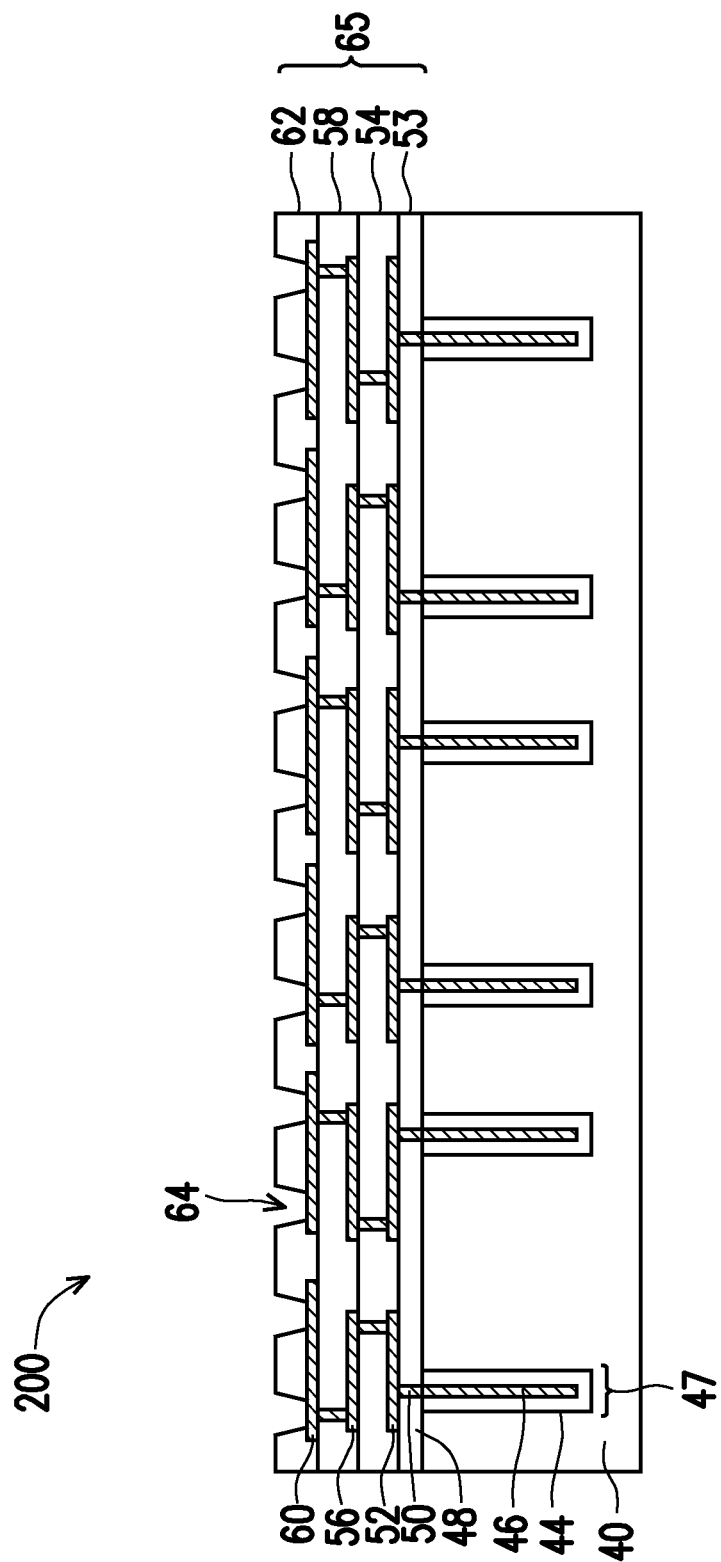

In FIG. 11, openings 64 are formed through the passivation layers to expose the top metallization pattern, the metallization pattern 60, for the formation of bump pads on the top metallization pattern. The openings 64 may be formed using, for example, acceptable photolithography and removal techniques, such as etching, milling, laser techniques, a combination thereof, or the like.

Figure 12:
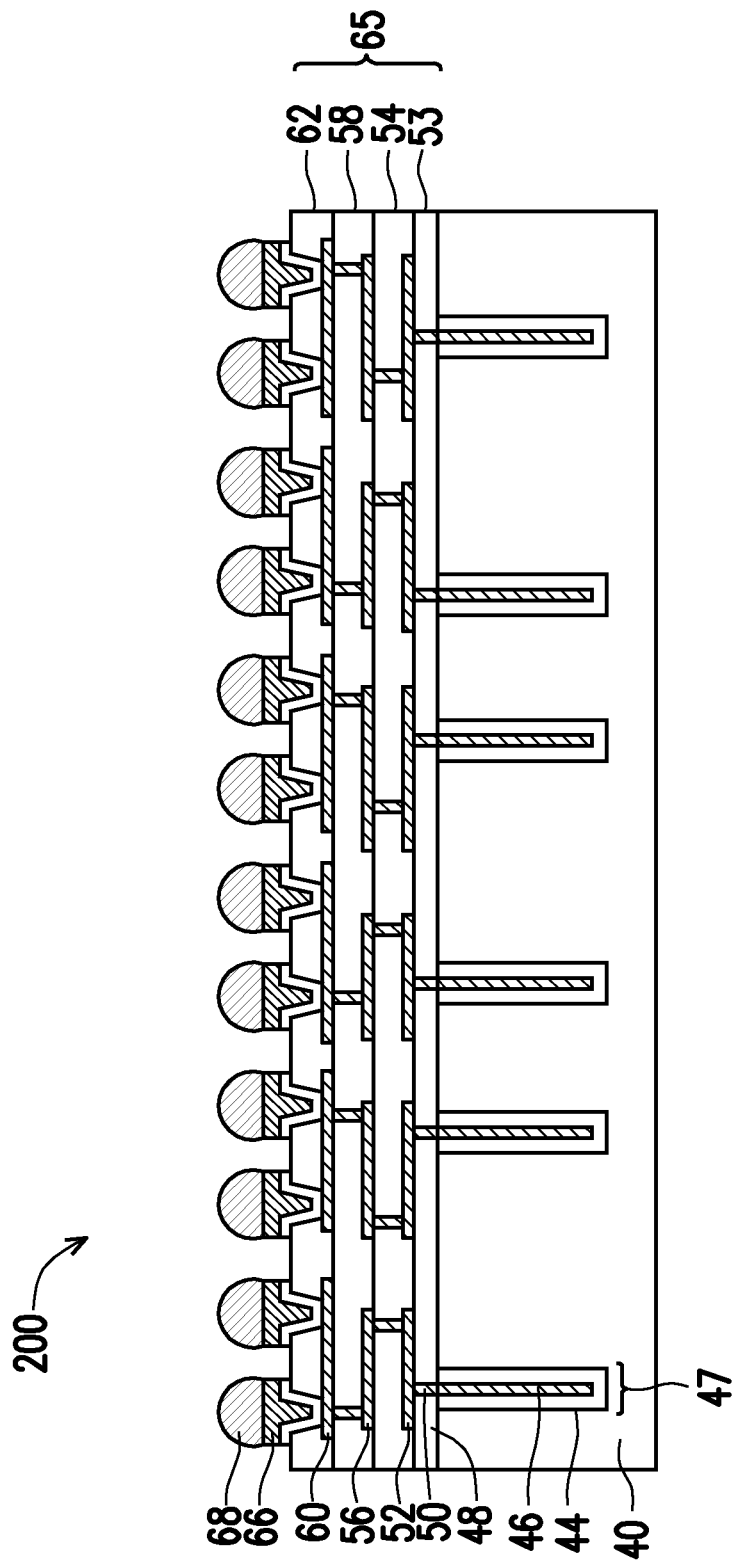

Referring to FIG. 12, conductive pads 66 are formed through the openings 64 on the top metallization layer, and conductive connectors 68 are formed on the conductive pads 66. In some embodiments, the conductive pads 66 include under bump metallurgies (UBMs). In the illustrated embodiment, the conductive pads 66 (UBMs) extend through the openings 64 of the dielectric layer and/or passivation layer of the redistribution structure 65 and also extend across the top surface of the redistribution structure 65. In another embodiment, the conductive pads 66 are formed in openings 64 of the dielectric layers of the redistribution structure 65.

As an example to form the pads, a seed layer (not shown) is formed at least in the openings 64 in the dielectric layer of the redistribution structure 65. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads 66. In the embodiment, where the conductive pads 66 are formed differently, more photoresist and patterning steps may be utilized.

In some embodiments, the conductive connectors 68 include a metal pillar with a metal cap layer, which may be a solder cap, over the metal pillar. The conductive connectors 68 including the pillar and the cap layer are sometimes referred to as micro-bumps (µbumps) 68. In some embodiments, the metal pillars include a conductive material such as copper, aluminum, gold, nickel, palladium, the like, or a combination thereof and may be formed by sputtering, printing, electro plating, electroless plating, CVD, or the like. The metal pillars may be solder free and have substantially vertical sidewalls. In some embodiments, a metal cap layer is formed on the top of the metal pillar. The metal cap layer may include nickel, tin, tin-lead, gold, copper, silver, palladium, indium, nickel-palladium-gold, nickel-gold, the like, or a combination thereof and may be formed by a plating process.

In another embodiment, the conductive connectors 68 do not include the metal pillars and are solder balls and/or bumps, such as controlled collapse chip connection (C4), electroless nickel immersion Gold (ENIG), electroless nickel electroless palladium immersion gold technique (EN-EPIG) formed bumps, or the like. In this embodiment, the bump conductive connectors 68 may include a conductive material such as solder, copper, aluminum, gold, nickel, silver, palladium, tin, the like, or a combination thereof. In this embodiment, the conductive connectors 68 are formed by initially forming a layer of solder through suitable methods such as evaporation, electroplating, printing, solder transfer, ball placement, or the like. Once a layer of solder has been formed on the structure, a reflow may be performed in order to shape the material into the desired bump shapes.

Figure 13:
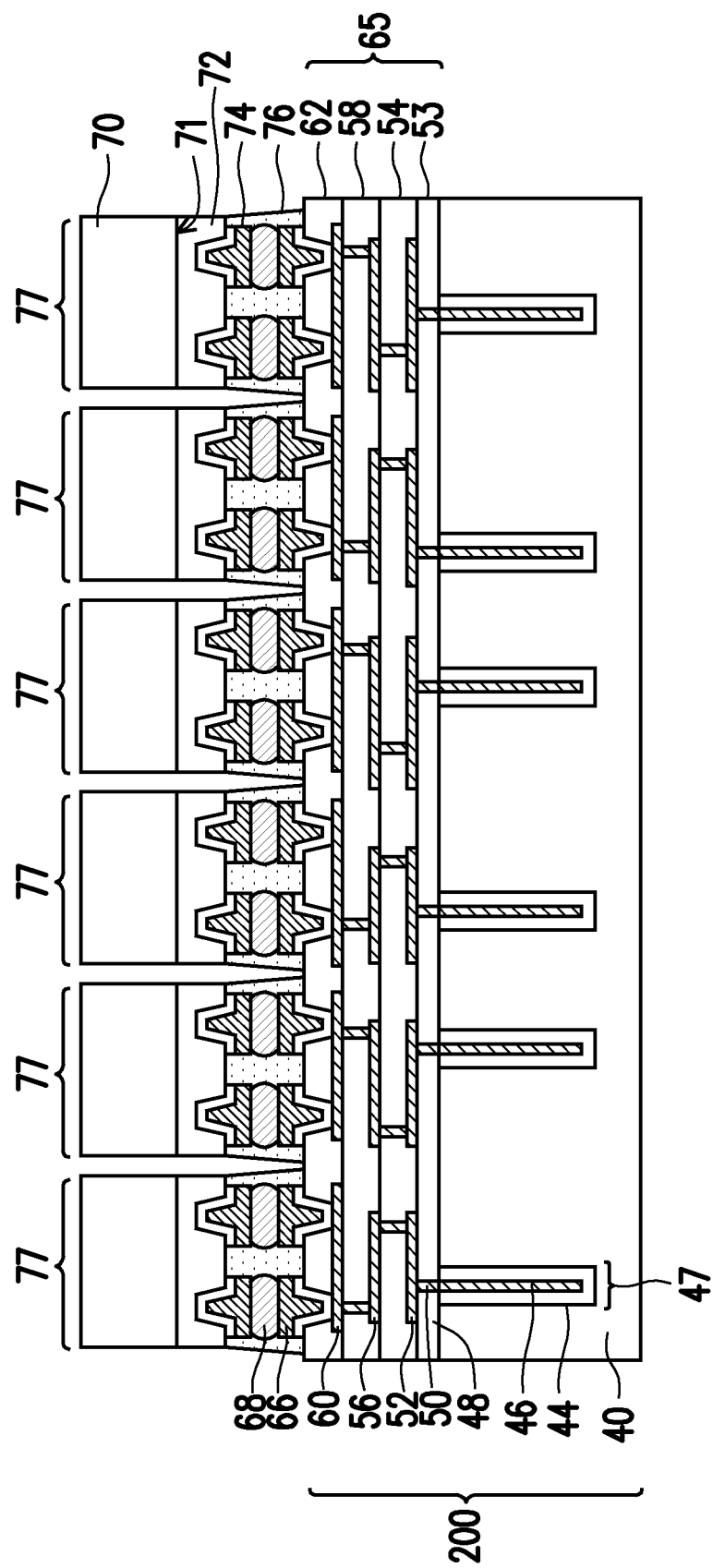

In FIG. 13, integrated circuit dies 77 are attached to the interposer 200 by conductive connectors 68 and an underfill 76 is dispensed between the integrated circuit dies 77 and the redistribution structure 65, for example, the top passivation layer. Before being attached to the conductive connectors 68, the integrated circuit dies 77 are formed.

A substrate 70 of the integrated circuit dies 77 may comprise transistors, active devices, passive devices, or the like. In an embodiment, the substrate 70 may include a bulk semiconductor substrate, semiconductor-on-insulator (SOI) substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, and the like, may be formed in and/or on an active surface 71.

An interconnect structure 72 comprising one or more dielectric layer(s) and respective metallization pattern(s) is formed on the active surface 71. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 74, such as conductive pillars (for example, comprising a metal such as copper), are formed in and/or on the interconnect structure 72 to provide an external electrical connection to the circuitry and devices. In some embodiments, the die connectors 74 protrude from the interconnect structure 72 to form pillar structure to be utilized when bonding the integrated circuit dies 77 to other structures. One of ordinary skill in the art will appreciate that the above examples are provided for illustrative purposes. Other circuitry may be used as appropriate for a given application.

More particularly, an IMD layer may be formed in the interconnect structure 72. The IMD layer may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by atomic layer deposition (ALD), or the like. The conductive material of the metallization patterns may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

The substrate 70 including the interconnect structure 72 is singulated into individual integrated circuit dies 77. Typically, the integrated circuit dies 77 contain the same circuitry, such as devices and metallization patterns, although the dies may have different circuitry. The singulation may include sawing, dicing, or the like.

Each of the integrated circuit dies 77 may include one or more logic dies (e.g., central processing unit, graphics processing unit, system-on-a-chip, field-programmable gate array (FPGA), microcontroller, or the like), memory dies (e.g., dynamic random access memory (DRAM) die, static random access memory (SRAM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 77 may be different sizes (e.g., different heights and/or surface areas), and in other embodiments, the integrated circuit dies 77 may be the same size (e.g., same heights and/or surface areas).

The integrated circuit dies 77 may be known good dies attached using a pick-and-place tool, and the conductive connectors 68 may be reflowed before the underfill material 76 is dispensed. The underfill material 76 may be a liquid epoxy, deformable gel, silicon rubber, a combination thereof.

Figure 14:
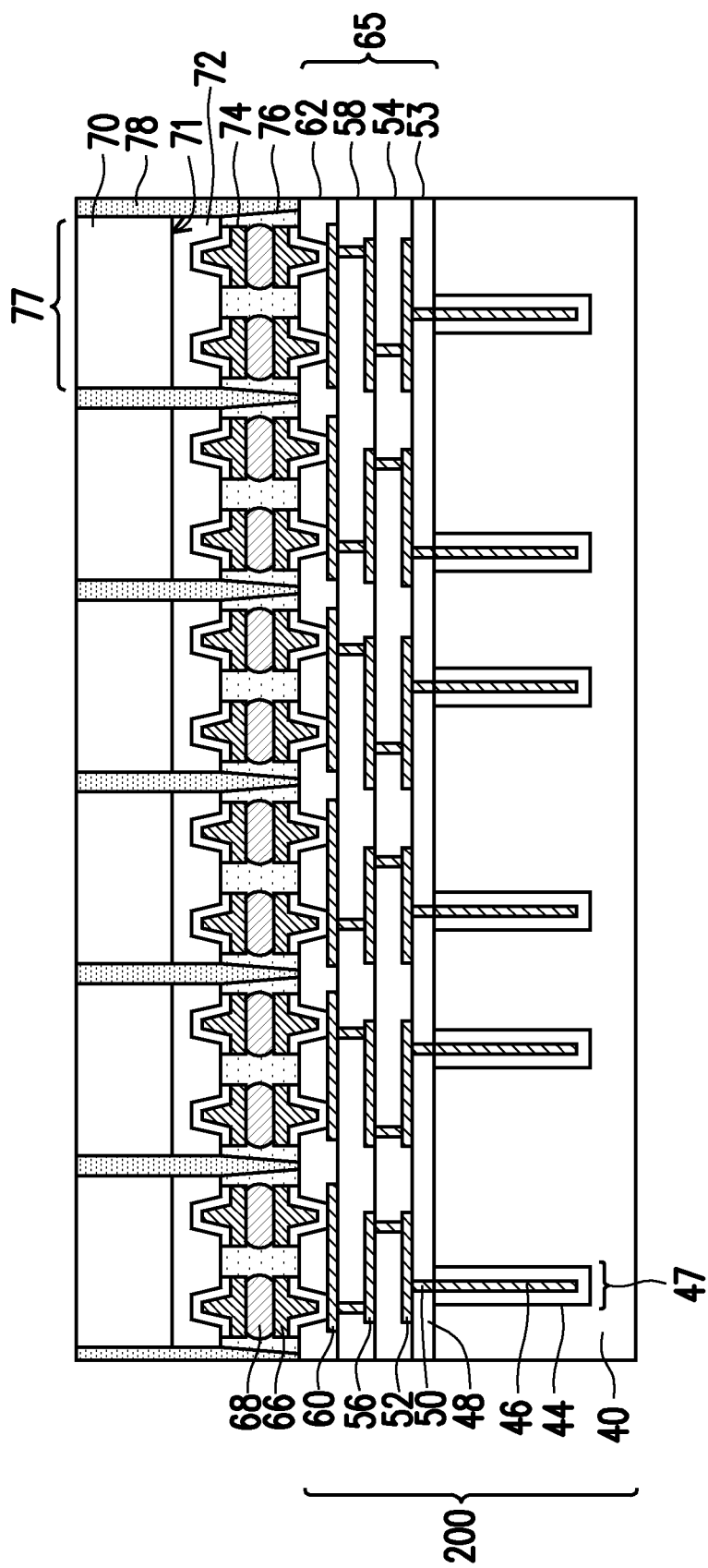

In FIG. 14, after the underfill material 76 is cured, an encapsulation is performed by forming encapsulant 78 on and around the various components. After formation, the encapsulant 78 surrounds the integrated circuit dies 77 and the underfill 76. The encapsulant 78 may be formed of a molding compound, epoxy, or the like, and may be applied by compression molding, transfer molding, or the like. The encapsulant 78 may be applied in liquid or semi-liquid form and then subsequently cured. The encapsulant 78 may be formed over the integrated circuit dies 77 such that integrated circuit dies 77 are buried or covered.

A planarization process may be performed, if desired, on the encapsulant 78 to expose the substrates 70 of the integrated circuit dies 77. Topmost surfaces of the encapsulant 78 the substrates 70 are coplanar after the planarization process within process variations. The planarization process may be, for example, a chemical-mechanical polish (CMP), a grinding process, or the like. In some embodiments, the planarization may be omitted.

Figure 15:
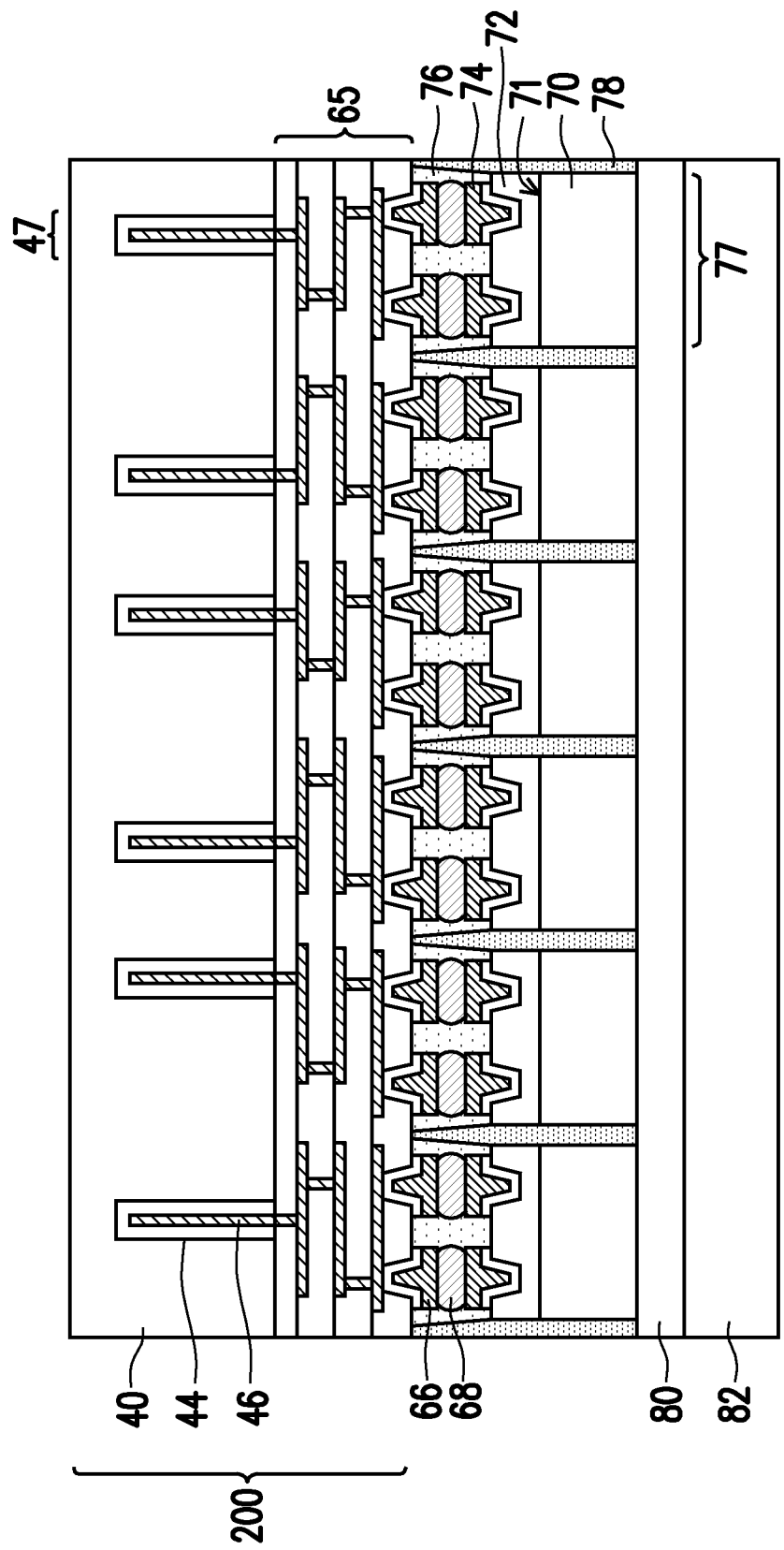

Back side processing of the substrate 40 of the interposer 200 is depicted in FIGS. 15 through 24. In FIG. 15, the assembly of FIG. 14 is attached to a carrier substrate 82 during the back side processing. The carrier substrate 82 may be attached to the integrated circuit dies 77 or the molding compound 78 using an adhesive 80. Generally, the carrier substrate 82 provides temporary mechanical and structural support during subsequent processing steps. In this manner, damage to an interposer is reduced or prevented. The carrier substrate 82 may comprise, for example, glass, silicon oxide, aluminum oxide, a combination thereof, or the like. The adhesive 80 may be any suitable adhesive, such as ultraviolet (UV) glue, which loses its adhesive property when exposed to UV lights.

Figure 16:
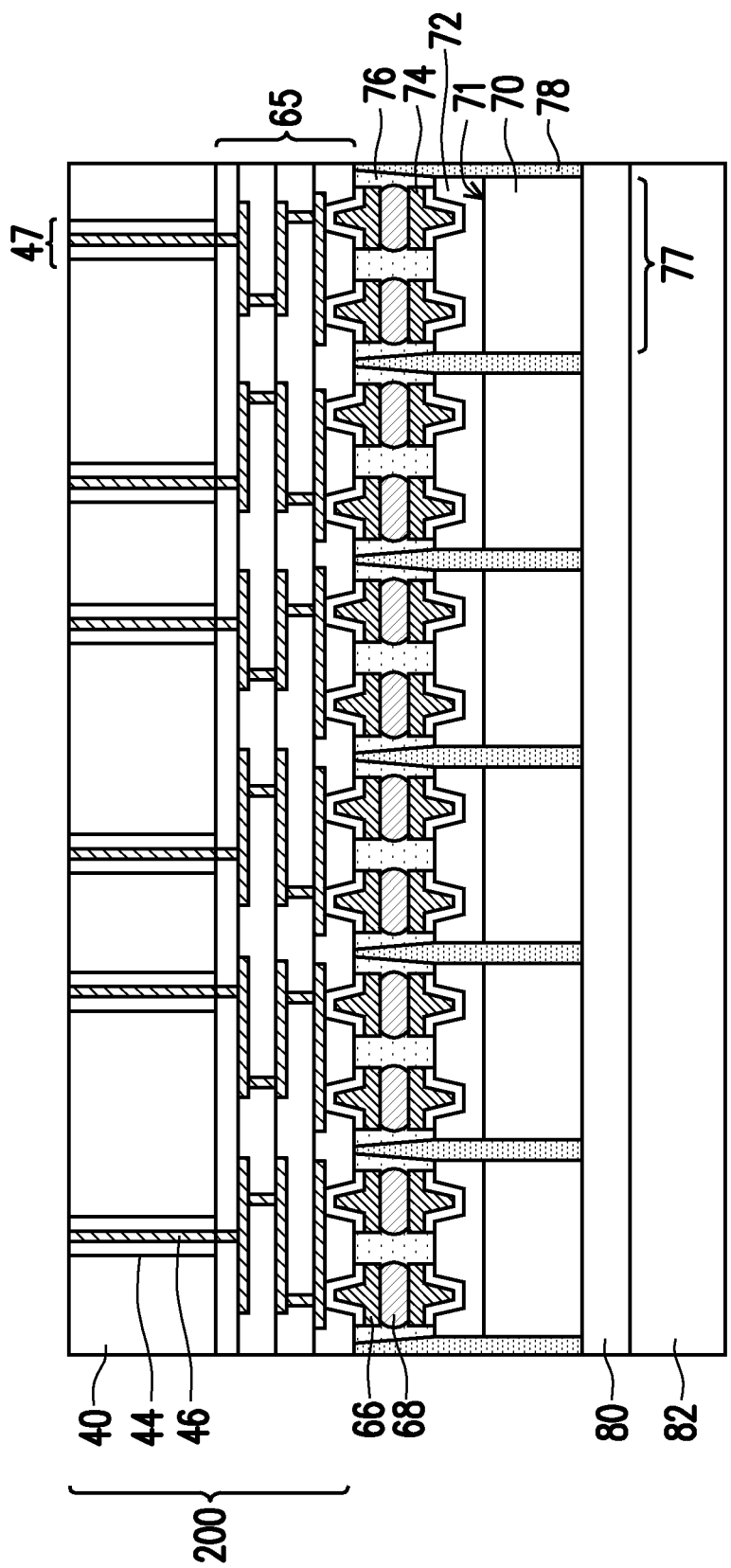

In FIG. 16, the backside of the substrate 40 is planarized to reveal the conductive material 46 and barrier layer 44 of the TSVs 47. The planarization process may be, for example, a chemical-mechanical polish (CMP).

Figure 17:
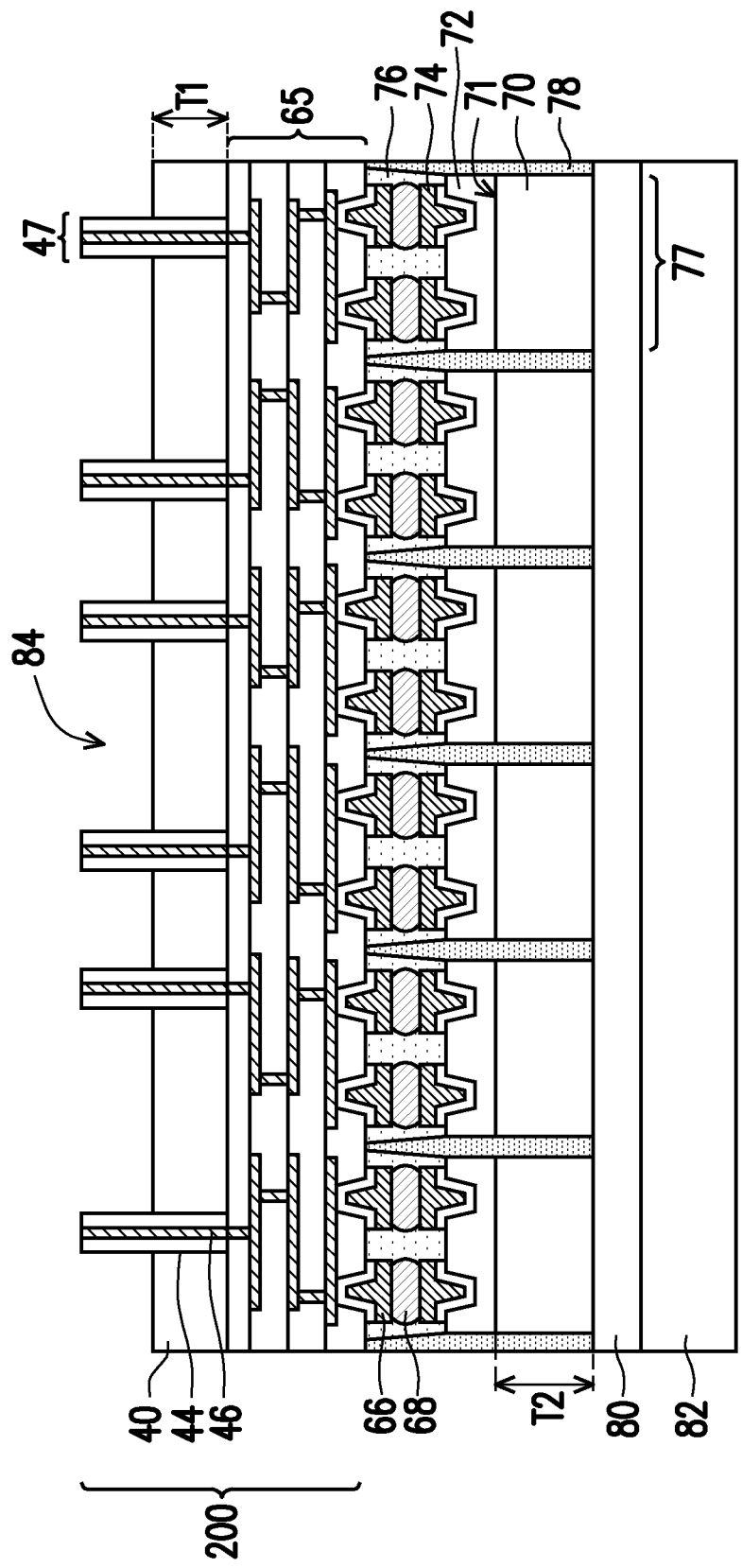

In FIG. 17, the substrate 40 is thinned such that the TSVs 47 protrude from the back side of the substrate 40. The thinning process may be performed using an etching process or a planarization process. For example, after the TSVs 47 are exposed, one or more wet etching processes having a high etch-rate selectivity between the material of the barrier layer 44 and the substrate 40 may be performed, thereby leaving the TSVs 47 protruding from the back side of the substrate 40. The etch process may also be, for example, a dry etch process. After the thinning of the substrate 40, recesses 84 are formed between the protruding TSVs 47.

After the thinning process, the substrate 40 of the interposer has a thickness Ti. In some embodiments, the thickness T1 of the substrate 40 is in a range from 1 μm to 50 μm. In some embodiments, the thickness T1 of the substrate 40 is less than 50 μm. In some embodiments, the substrate 70 of at least one of the integrated circuit dies 77 has a thickness T2. In some embodiments, the ratio of the thickness T2 of the substrate 70 of the integrated circuit dies 77 to the thickness T1 of the substrate 40 of the interposer is in a range from 10 to 50. In other embodiments, the ratio of the thickness T2 of the substrate 70 of the integrated circuit dies 77 to the thickness T1 of the substrate 40 of the interposer is can be smaller than 10 or larger than 50.

Figure 18:
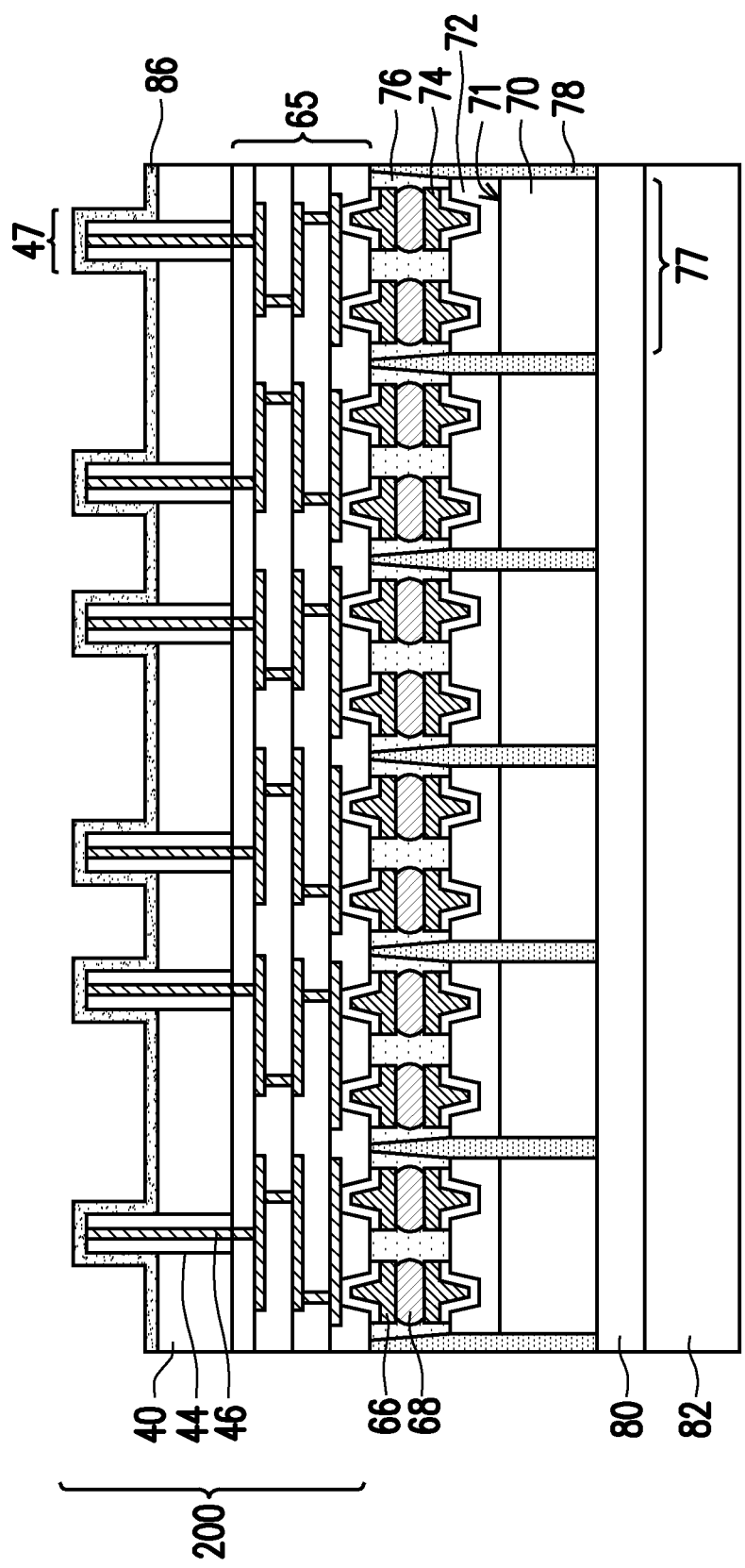

In FIG. 18, dielectric layer 86 is conformally deposited over the back side of the substrate 40. Specifically, the dielectric layer 86 is formed in the recesses 84 and along sidewalls and upper surfaces of the TSVs 47. The dielectric layer 86 may be, for example, silicon oxide, silicon nitride, a combination thereof, or the like. In some embodiments, the dielectric layer 86 may be deposited by any suitable method known in the art, such as, CVD, PECVD, the like, or a combination thereof.

Figure 19:
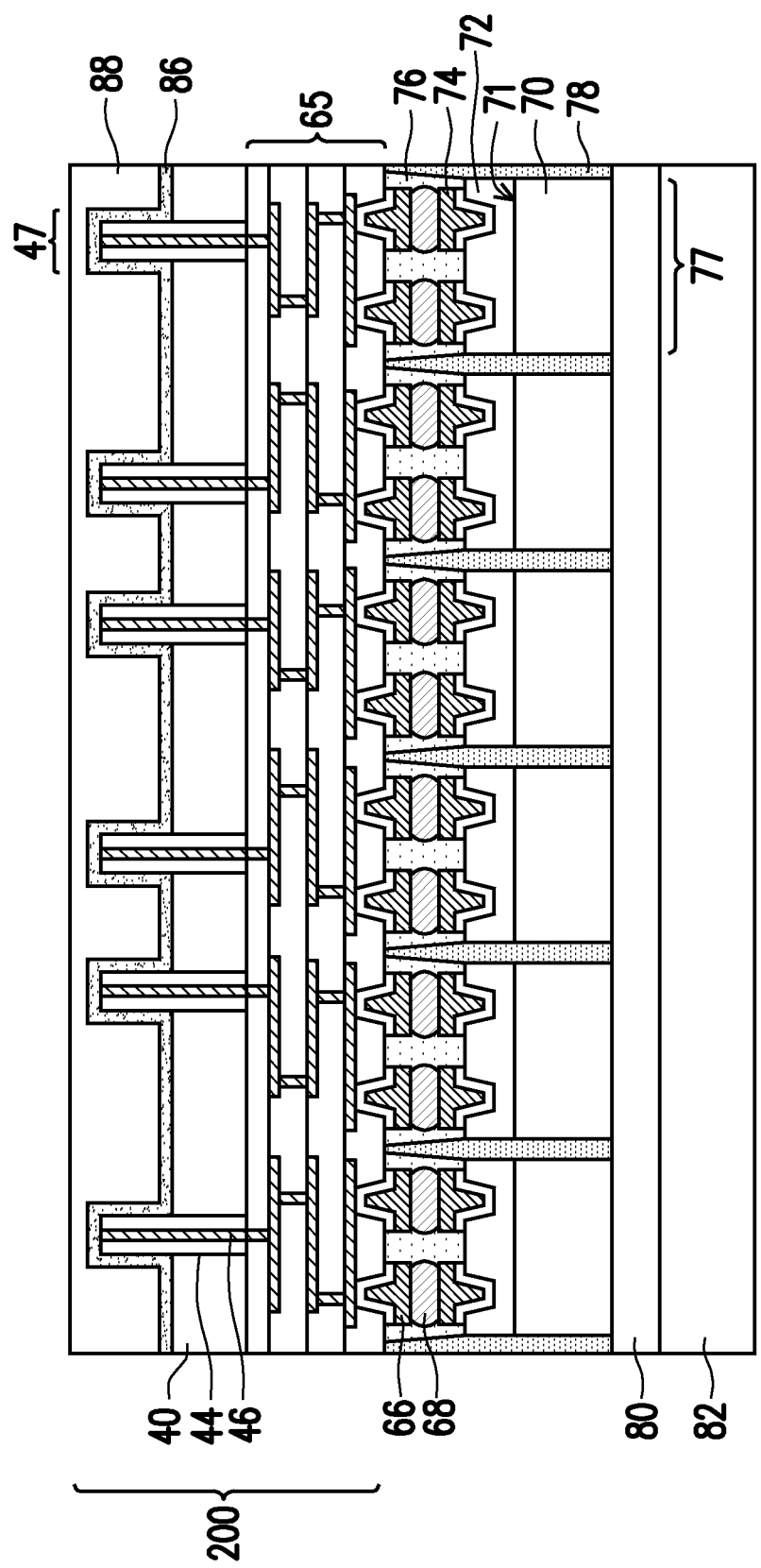

In FIG. 19, dielectric layer 88 is deposited over the dielectric layer 86. The dielectric layer 88 may be, for example, silicon oxide, silicon nitride, a combination thereof, or the like. The dielectric layer 88 may be deposited by any suitable method known in the art, such as, CVD, PECVD, the like, or a combination thereof. In some embodiments, the dielectric layer 88 is a different material composition than the dielectric layer 86.

Figure 20:
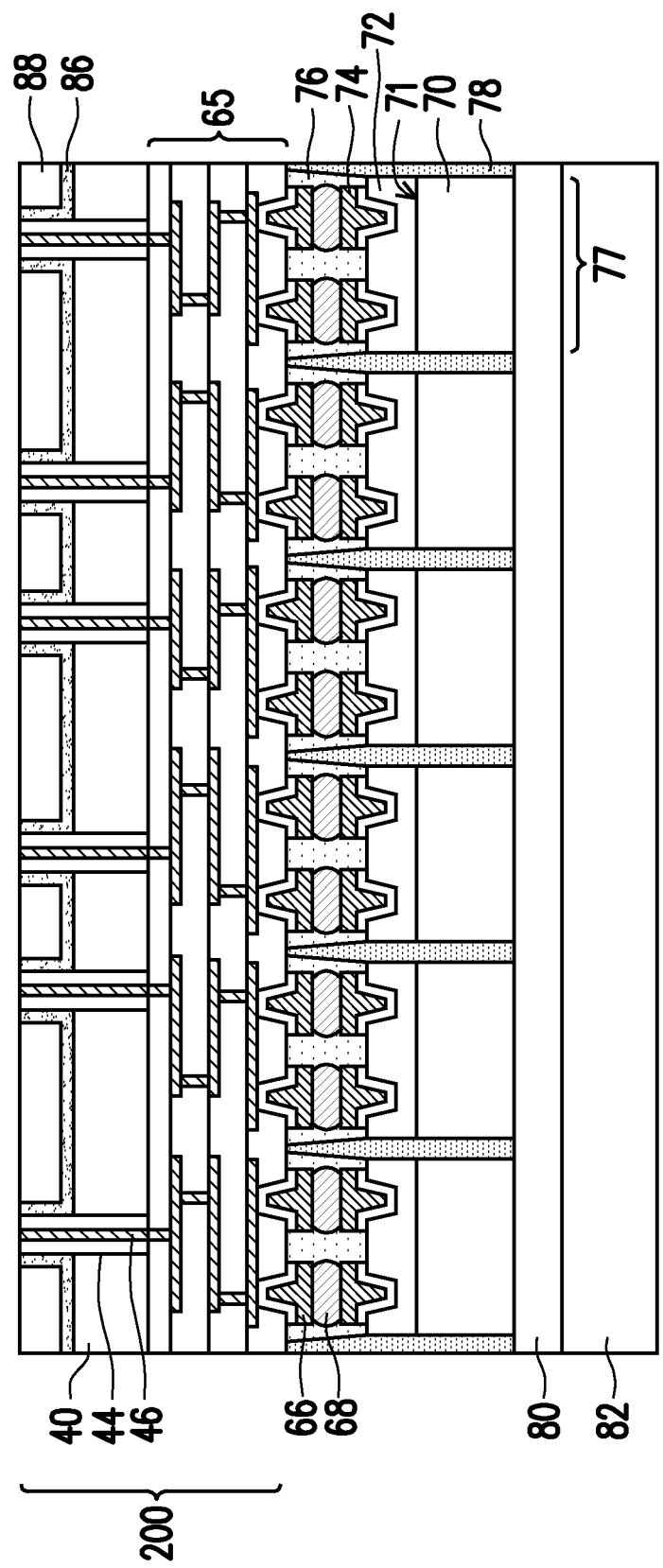

In FIG. 20, the back side is then planarized, for example, by CMP, such that the barrier layer 44 and the conductive material 46 of the TSVs 47 are exposed on the back side. After the planarization, surfaces of the barrier layer 44, the conductive material, the dielectric layer 86, and the dielectric layer 88 are coplanar within process variations.

Figure 21:
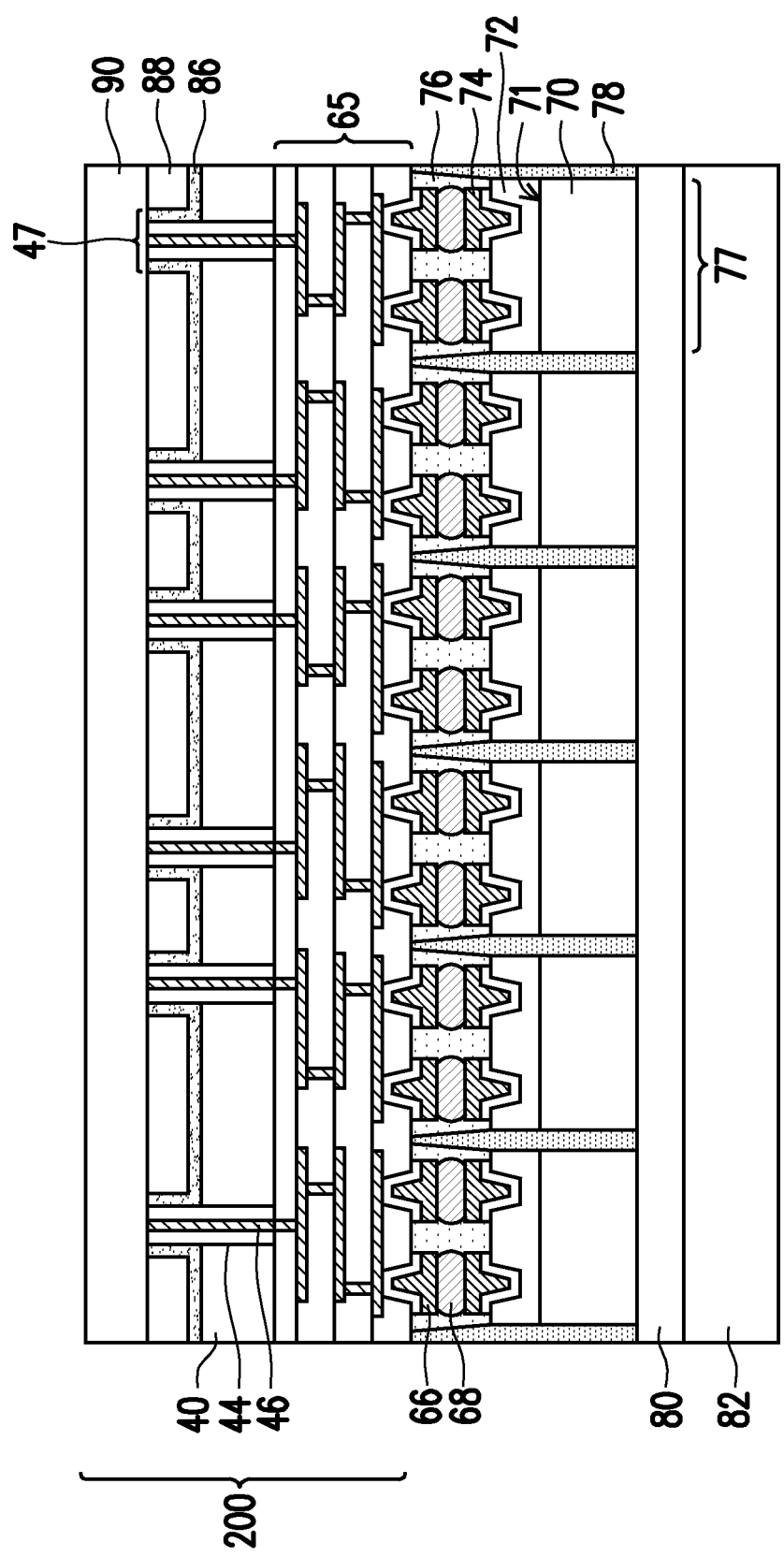

In FIG. 21, a passivation layer 90 is formed over the planarized TSVs 47 and dielectric layers 86 and 88. In some embodiments, the passivation layer 90 protects and passivates the underlying layers from chemicals in subsequent processing. The passivation layer 90 is formed on the back side over the dielectric layers 86 and 88, and may be, for example, a polyimide, BPSG, a combination thereof, or the like, formed by a spin-on technique, CVD, ALD, a combination thereof, or the like.

Figure 22:
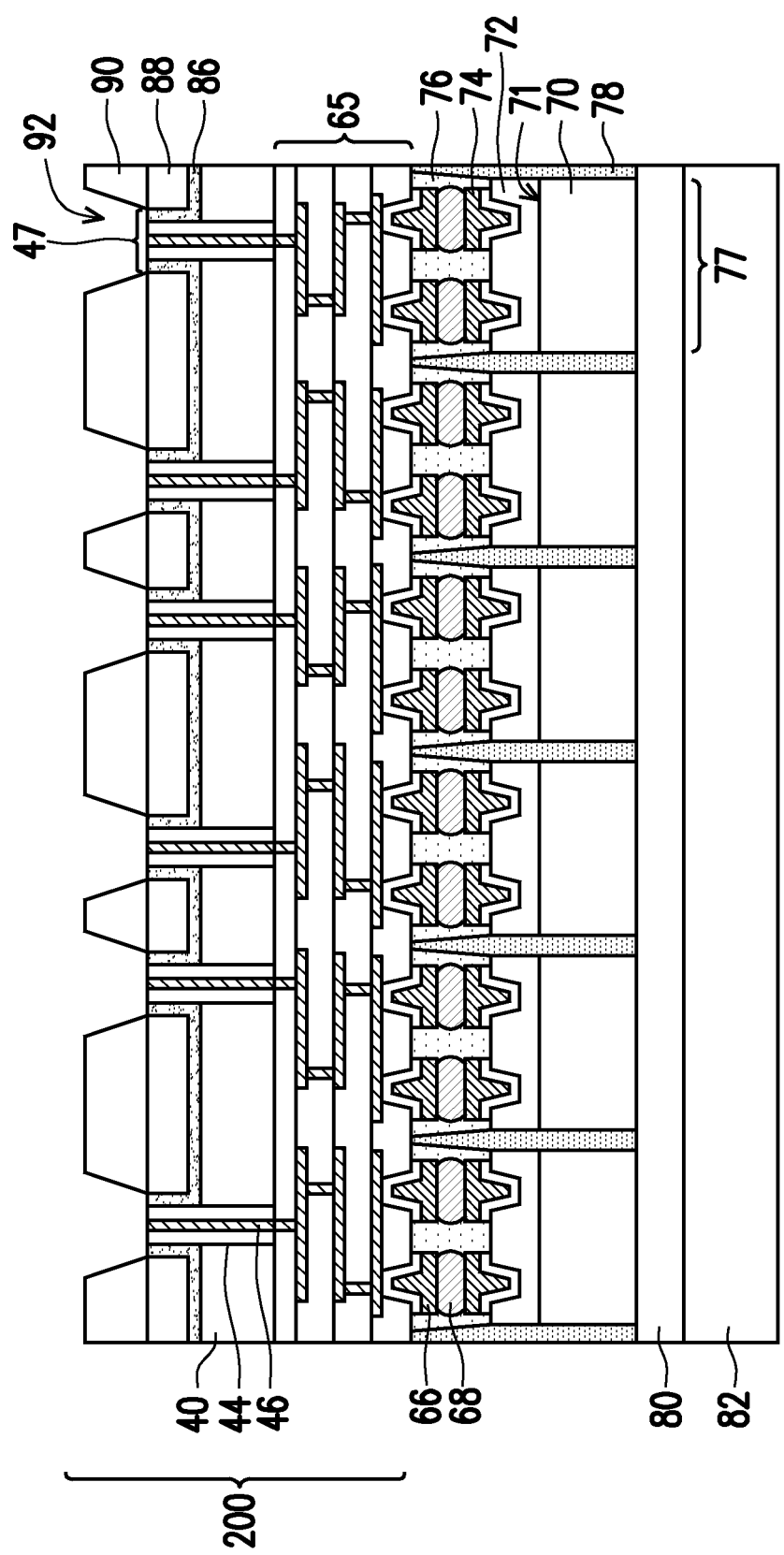

In FIG. 22, openings 92 are formed through the passivation layer 90 to expose, for example, the barrier layers 44 and the conductive material 46 of the TSVs 47, for the formation of conductive pads 94. The openings 92 may be formed using, for example, acceptable photolithography and removal techniques, such as etching, milling, laser techniques, a combination thereof, or the like.

Figure 23:
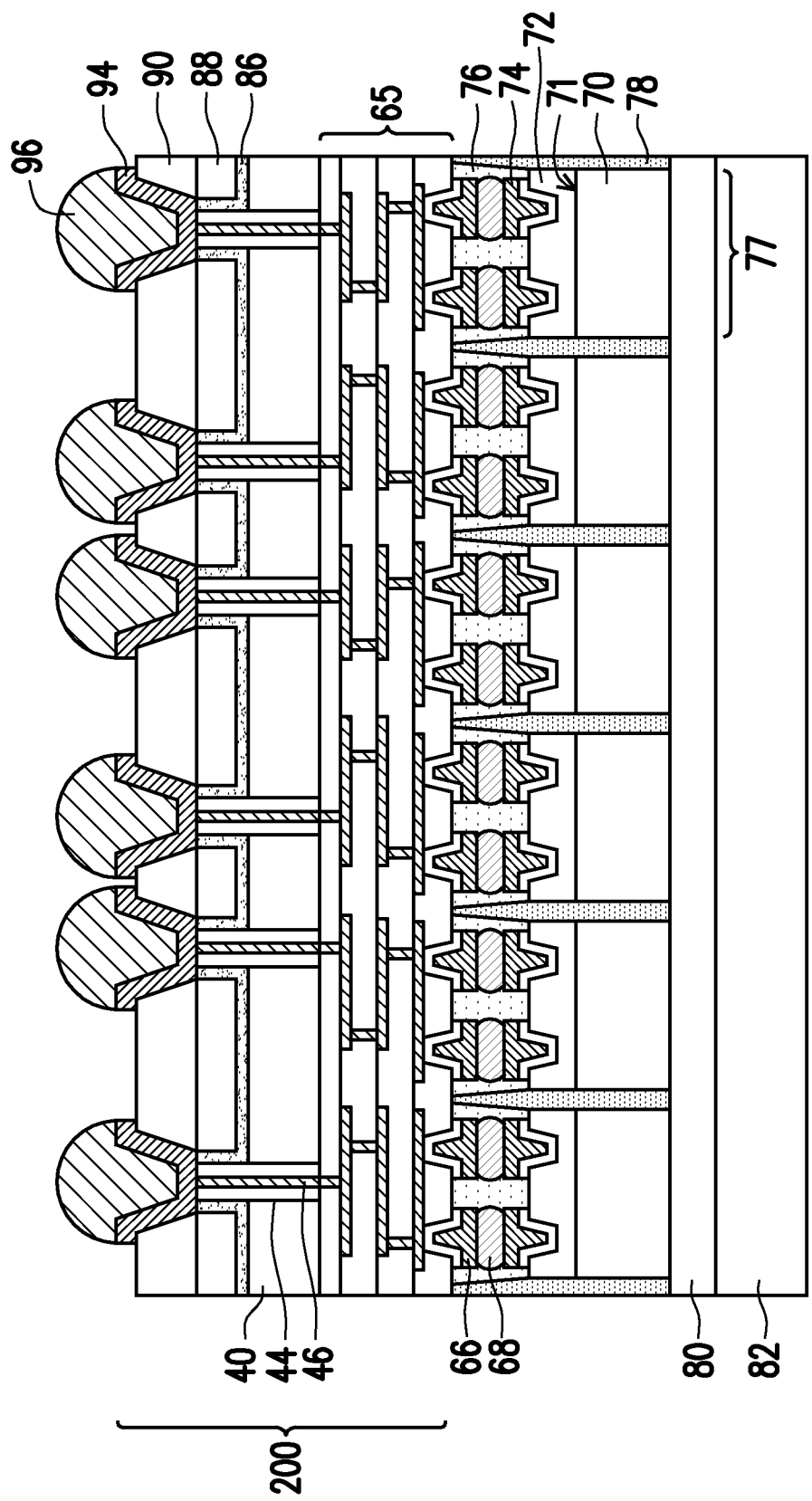

In FIG. 23, conductive pads 94 are formed through the openings 92 and coupled to the conductive material 46 of the TSVs 47, and conductive connectors 96 are formed on the conductive pads 94. In some embodiments, the conductive pads 94 include under bump metallurgies (UBMs). In the illustrated embodiment, the conductive pads 94 (UBMs) extend through the openings 92 of the passivation layer 90 and also extend across the top surface of the passivation layer 90. In another embodiment, the conductive pads 94 are formed in openings 92 of the passivation layer 90.

As an example to form the conductive pads 94, a seed layer (not shown) is formed at least in the openings 92 in the passivation layer 90. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the pads. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pads 94. In the embodiment, where the conductive pads 94 are formed differently, more photoresist and patterning steps may be utilized.

In some embodiments, the conductive connectors 96 are solder balls and/or bumps, such as controlled collapse chip connection (C4), electroless nickel immersion Gold (ENIG), electroless nickel electroless palladium immersion gold technique (ENEPIG) formed bumps, or the like. In this embodiment, the bump conductive connectors 96 may include a conductive material such as solder, copper, aluminum, gold, nickel, silver, palladium, tin, the like, or a combination thereof. In this embodiment, the conductive connectors 96 are formed by initially forming a layer of solder through suitable methods such as evaporation, electroplating, printing, solder transfer, ball placement, or the like. Once a layer of solder has been formed on the structure, a reflow may be performed in order to shape the material into the desired bump shapes.

In another embodiment, the conductive connectors 96 include a metal pillar with a metal cap layer, which may be a solder cap, over the metal pillar. In some embodiments, the metal pillars include a conductive material such as copper, aluminum, gold, nickel, palladium, the like, or a combination thereof and may be formed by sputtering, printing, electro plating, electroless plating, CVD, or the like. The metal pillars may be solder free and have substantially vertical sidewalls. In some embodiments, a metal cap layer is formed on the top of the metal pillar. The metal cap layer may include nickel, tin, tin-lead, gold, copper, silver, palladium, indium, nickel-palladium-gold, nickel-gold, the like, or a combination thereof and may be formed by a plating process.

It should be noted that FIG. 23 depicts the conductive pads 94 as directly coupled to the TSVs 47; however, one or more metallization layers and IMD layers may be formed on the back side of the substrate 40 to electrically couple the conductive pads 94 to the TSVs 47. The back side metallization layers may be formed of any suitable conductive material, such as copper, copper alloys, aluminum, silver, gold, combinations thereof, or the like, formed by any suitable technique, such as electro-chemical plating (ECP), electroless plating, other deposition methods such as sputtering, printing, and CVD, a combination thereof, or the like.

Figure 24:
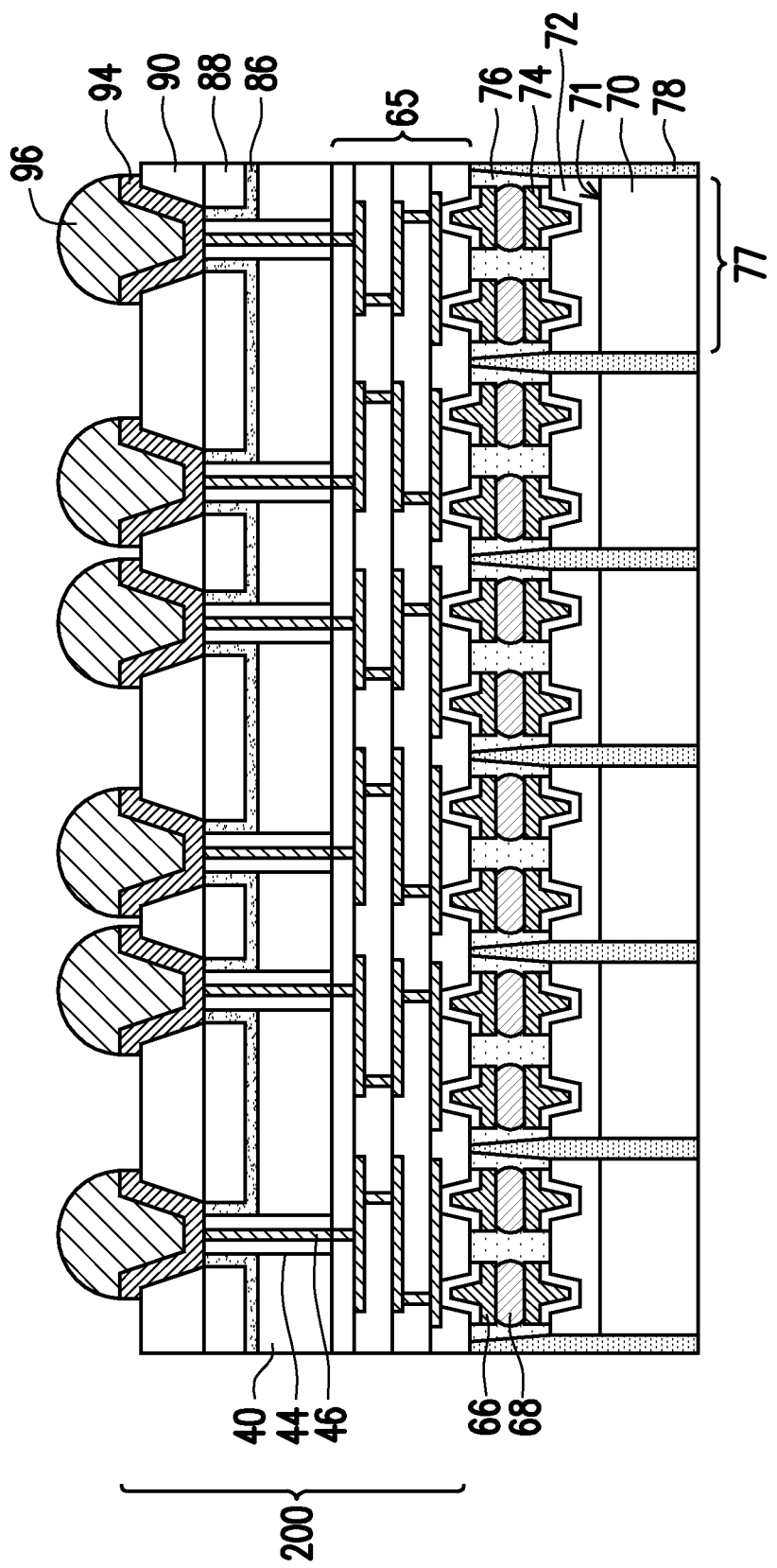

In FIG. 24, the carrier substrate 82 is removed, for example, by exposing the adhesive 80 to UV radiation. The assembly is then diced into individual packages with an interposer and any number of dies, such as the package shown in FIG. 1.

FIGS. 25 through 31 illustrate various intermediate stages in forming an interposer 400 and a die attached to the interposer 400 that includes a buffer structure 120, such as the structure illustrated in FIG. 2. It should be appreciated that this order is provided for illustrative purposes, and that other sequences may be used. This embodiment is similar to the previous embodiment in FIGS. 1 and 3 through 24 except that this embodiment includes a buffer structure 120 between the interposer 400 and the package substrate 300. Details regarding this embodiment that are similar to those for the previously described embodiment will not be repeated herein.

Figure 25:
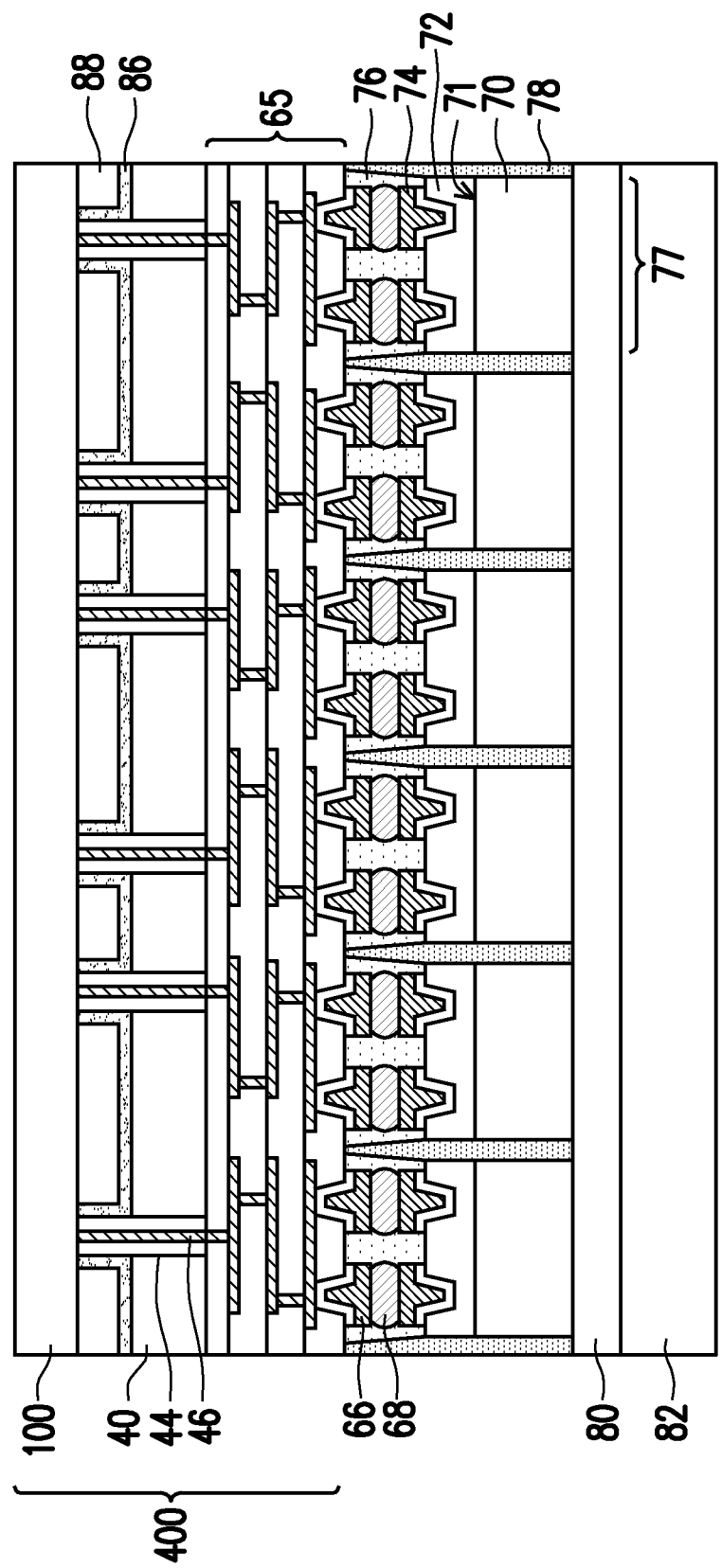
FIGS. 25 through 31 illustrate various intermediate stages in the fabrication of a package structure including an interposer in accordance with some embodiments.

FIGS. 25 through 28 illustrate the formation of a buffer structure 120 on the interposer 400. In FIG. 25, a first buffer layer 100 is formed over the dielectric layers 86 and 88 and the TSVs 47. The processing prior to FIG. 25 is similar to the processing described above in FIGS. 3 through 20 and the description is not repeated herein.

The first buffer layer 100 may be formed using a spin-on technique, CVD, ALD, a combination thereof, or the like. The first buffer layer 100 can relieve stress in the package structure and prevent deformation and cracking of the substrate 40 and/or the integrated circuit dies 77. The first buffer layer 100 may include one or more polymer layers, such as a polyimide. In some embodiments, the first buffer layer 100 may be a polymer layer with a Young's modulus in a range from 1 gigapascal (GPa) to 10 GPa. In some embodiments, the first buffer layer 100 is formed to have thickness in a range from 1 µm to 20 µm.

Figure 26:
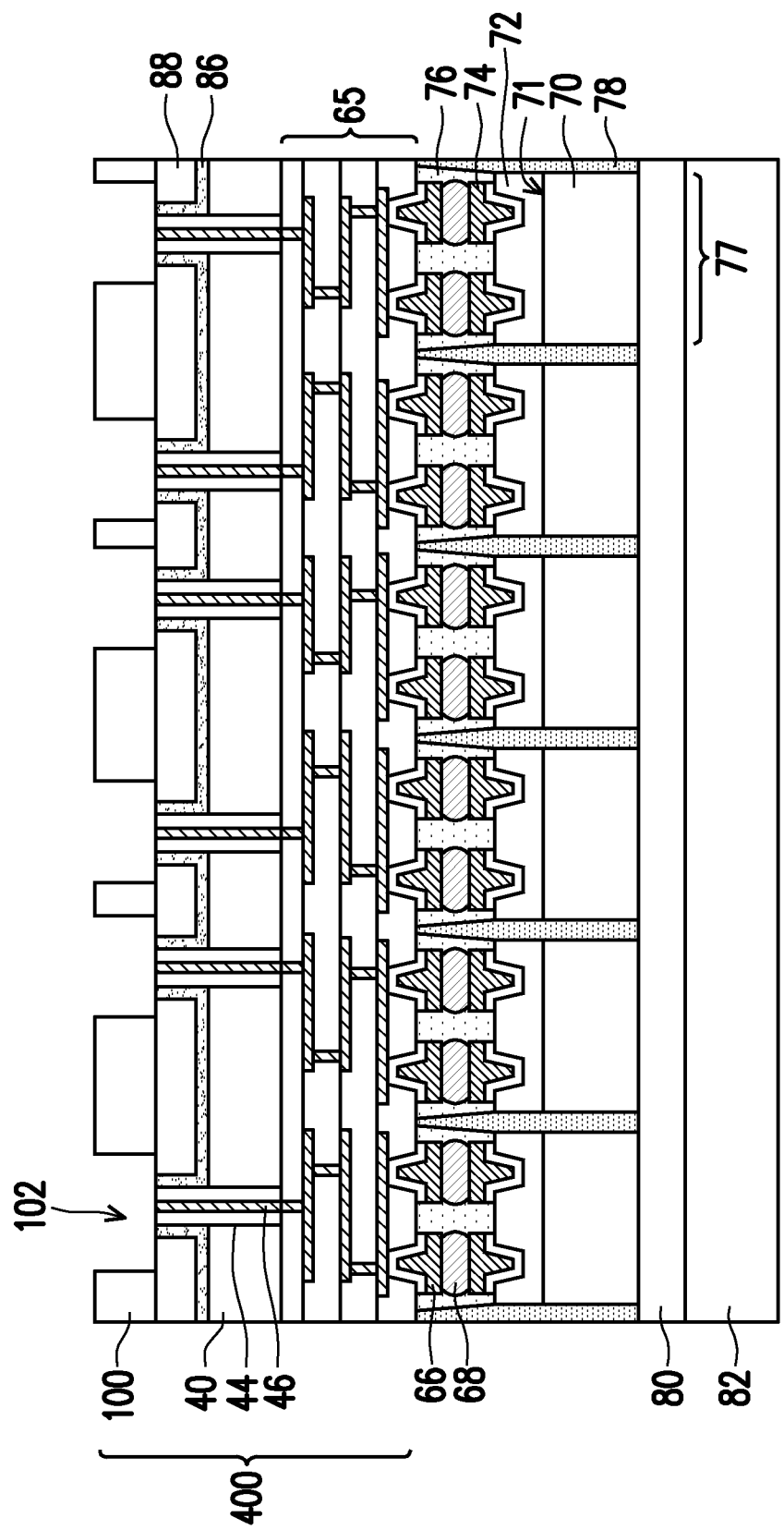

In FIG. 26, openings 102 are formed in the first buffer layer 100 for the formation of a metallization pattern 104. The openings 102 expose the conductive material 46 of the TSVs 47. The openings 102 may be formed using, for example, acceptable photolithography and removal techniques, such as etching, milling, laser techniques, a combination thereof, or the like. using acceptable photolithography and etching techniques.

Figure 27:
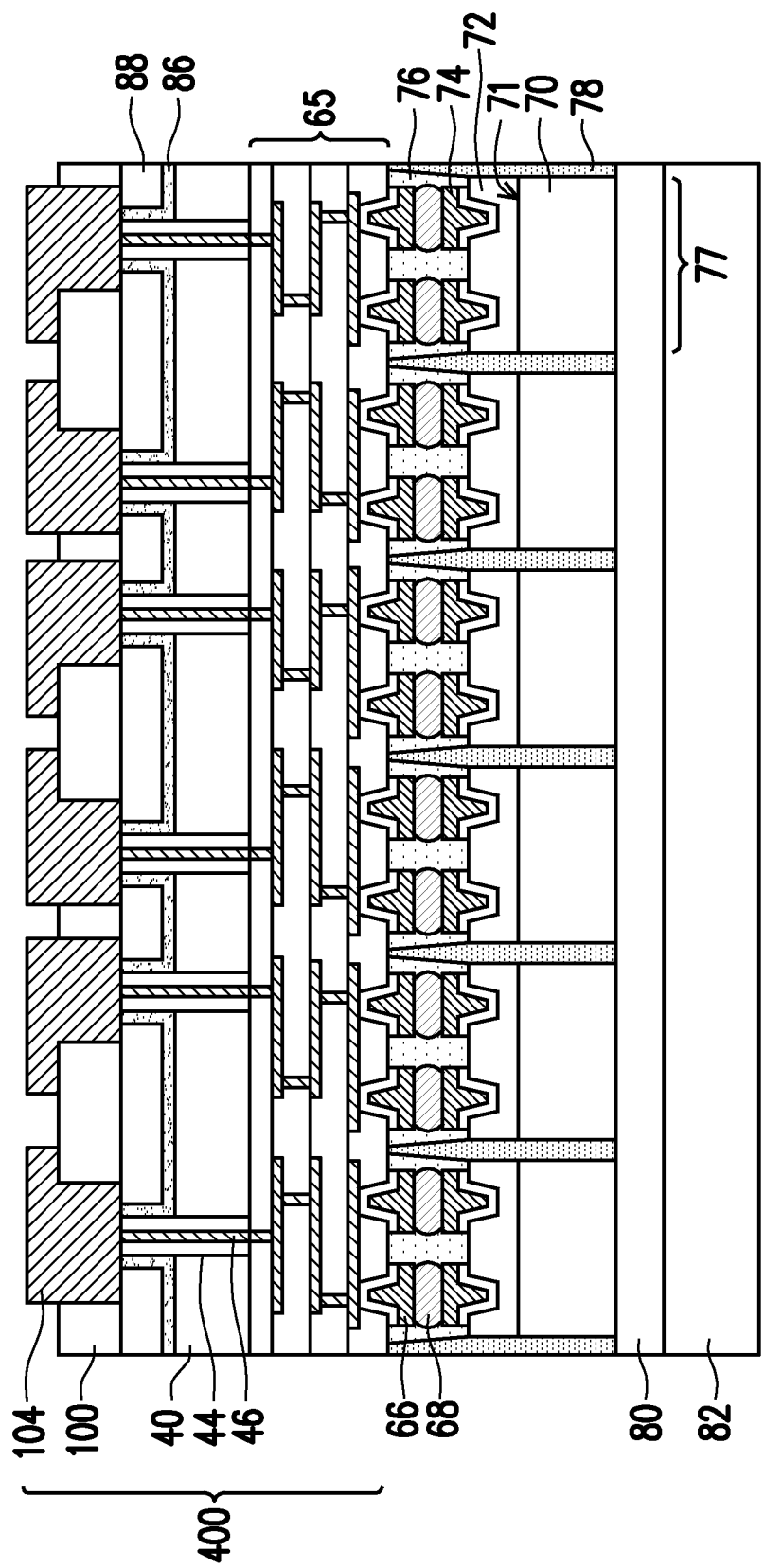

In FIG. 27, metallization pattern 104 including conductive vias and conductive lines are formed in the openings 102 and over the first buffer layer 100. The metallization pattern 104 includes conductive elements extending along the major surface of the first buffer layer 100 and conductive elements extending through the first buffer layer 100 to physically and electrically coupled to the TSVs 47. As an example to form the metallization pattern 104, a seed layer (not shown) is formed over the first buffer layer 100 and in the openings 102 extending through the first buffer layer 100. A photoresist (not shown) is then formed and patterned on the seed layer. The patterning forms openings through the photoresist to expose the seed layer, with the pattern of the openings corresponding to the metallization pattern 104. A conductive material is then formed in the openings of the photoresist and on the exposed portions of the seed layer. The conductive material may be formed by plating, such as electroplating or electroless plating, CVD, PVD, or the like. The conductive material may comprise a metal, like copper, nickel, aluminum, copper aluminum, tungsten, titanium, combinations thereof, or the like. The combination of the conductive material and underlying portions of the seed layer form the metallization pattern 104. The photoresist and portions of the seed layer on which the conductive material is not formed are removed. Once the photoresist is removed, exposed portions of the seed layer are removed, such as by using an acceptable etching process, such as by wet or dry etching. The combination of the first buffer layer 100 and the metallization pattern 104 form a backside redistribution layer.

Figure 28:
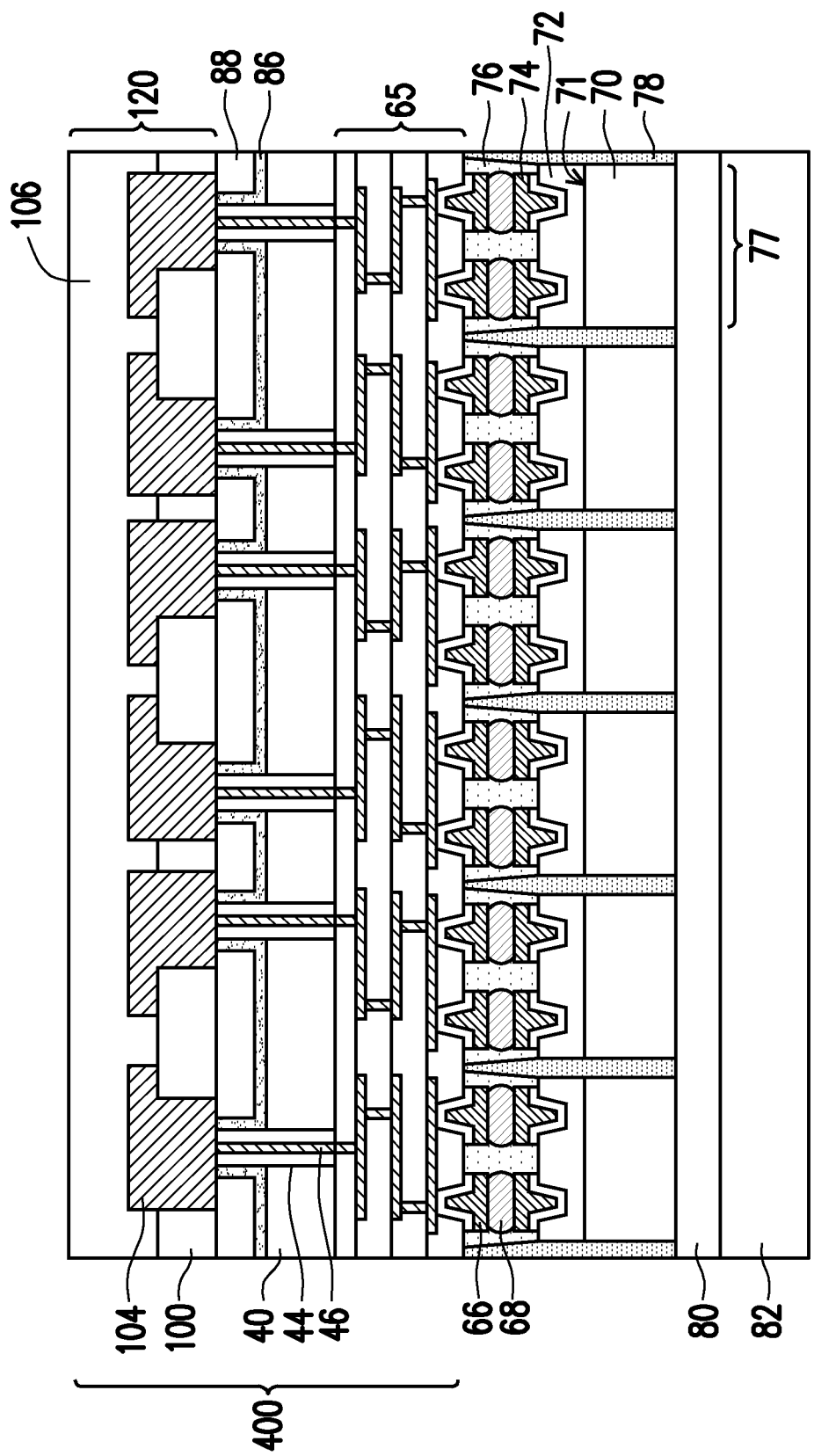

In FIG. 28, a second buffer layer 106 is deposited over the first buffer layer 100 and metallization pattern 104. The first buffer layer 100, the metallization pattern 104, and the second buffer layer 106 for the buffer structure 120. The second buffer layer 106 may be formed using a spin-on technique, CVD, ALD, a combination thereof, or the like. Together with the first buffer layer 100, the second buffer layer 106 can relieve stress in the package structure and prevent deformation and cracking of the substrate 40 and/or the integrated circuit dies 77. The second buffer layer 106 may include one or more polymer layers, such as a polyimide. In some embodiments, the second buffer layer 106 may be a polymer layer with a Young's modulus in a range from 1 gigapascal (GPa) to 10 GPa. In some embodiments, the second buffer layer 106 is formed to have thickness in a range from 1 μm to 20 μm.

Figure 29:
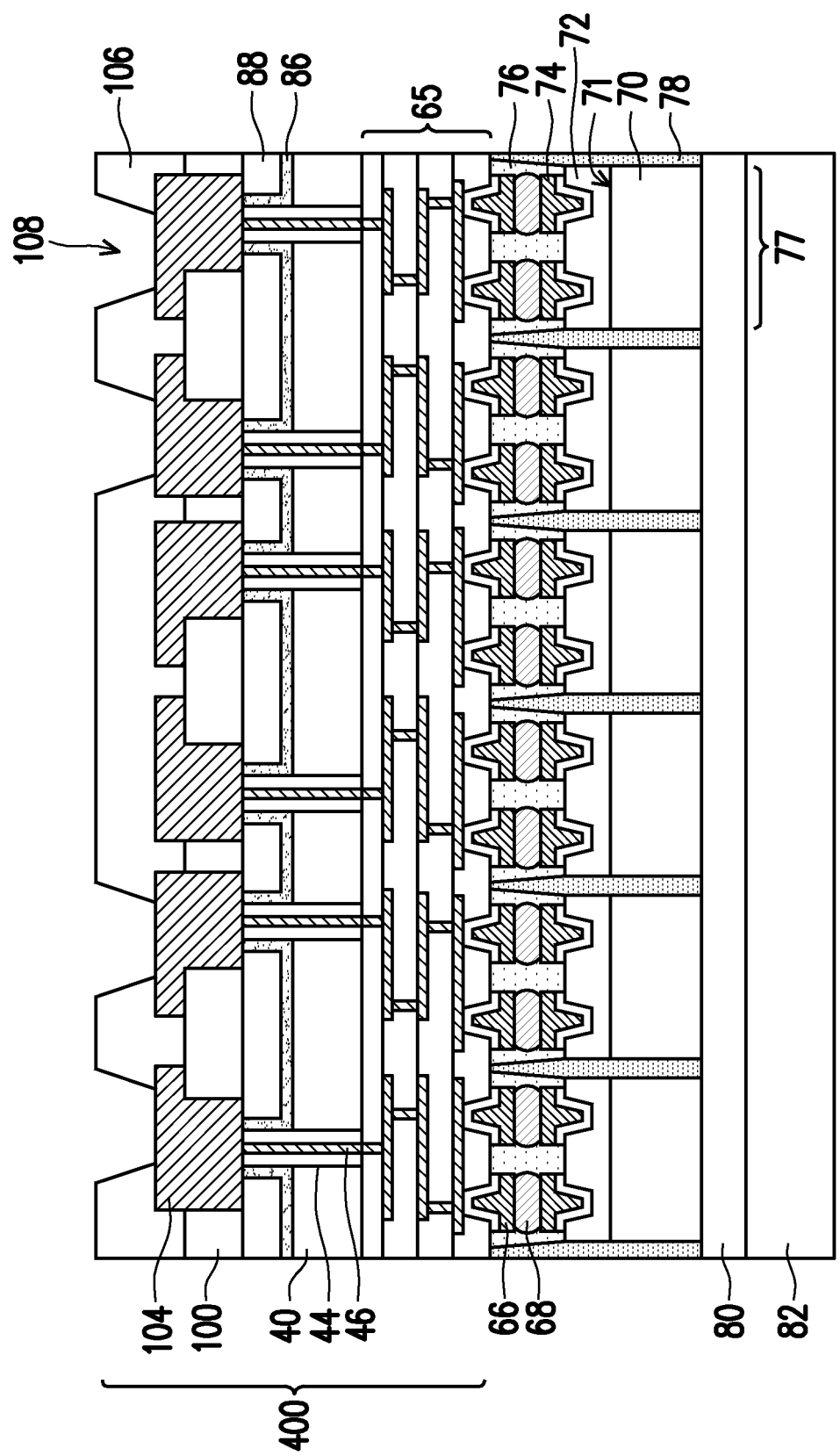

In FIG. 29, openings 108 are formed in the second buffer layer 106 for the formation of conductive pads 110. The openings 102 expose the metallization pattern 104 and may be formed similar to the openings 102 described above the description is not repeated herein.

Figure 30:
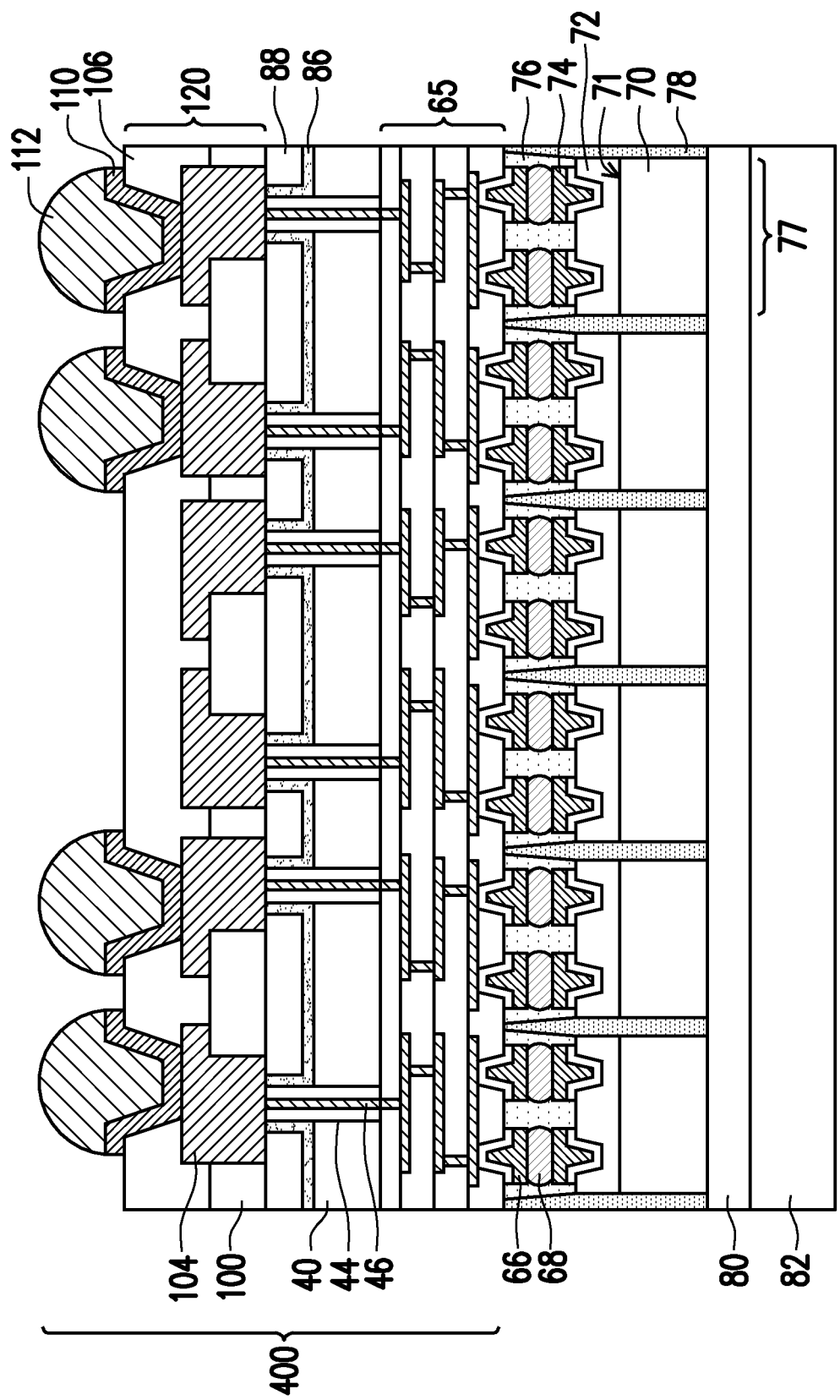

In FIG. 30, conductive pads 110 are formed through the openings 108 and coupled to the metallization pattern 104, and conductive connectors 112 are formed on the conductive pads 110. The conductive pads 110 are similar to the conductive pads 94 described above and the description is not repeated herein. The conductive connectors 112 are similar to the conductive connectors 96 described above and the description is not repeated herein.

Although FIGS. 25 through 30 illustrates two buffer layers and a single metallization pattern, other embodiments may include more buffer layers and metallization patterns.

Figure 31:
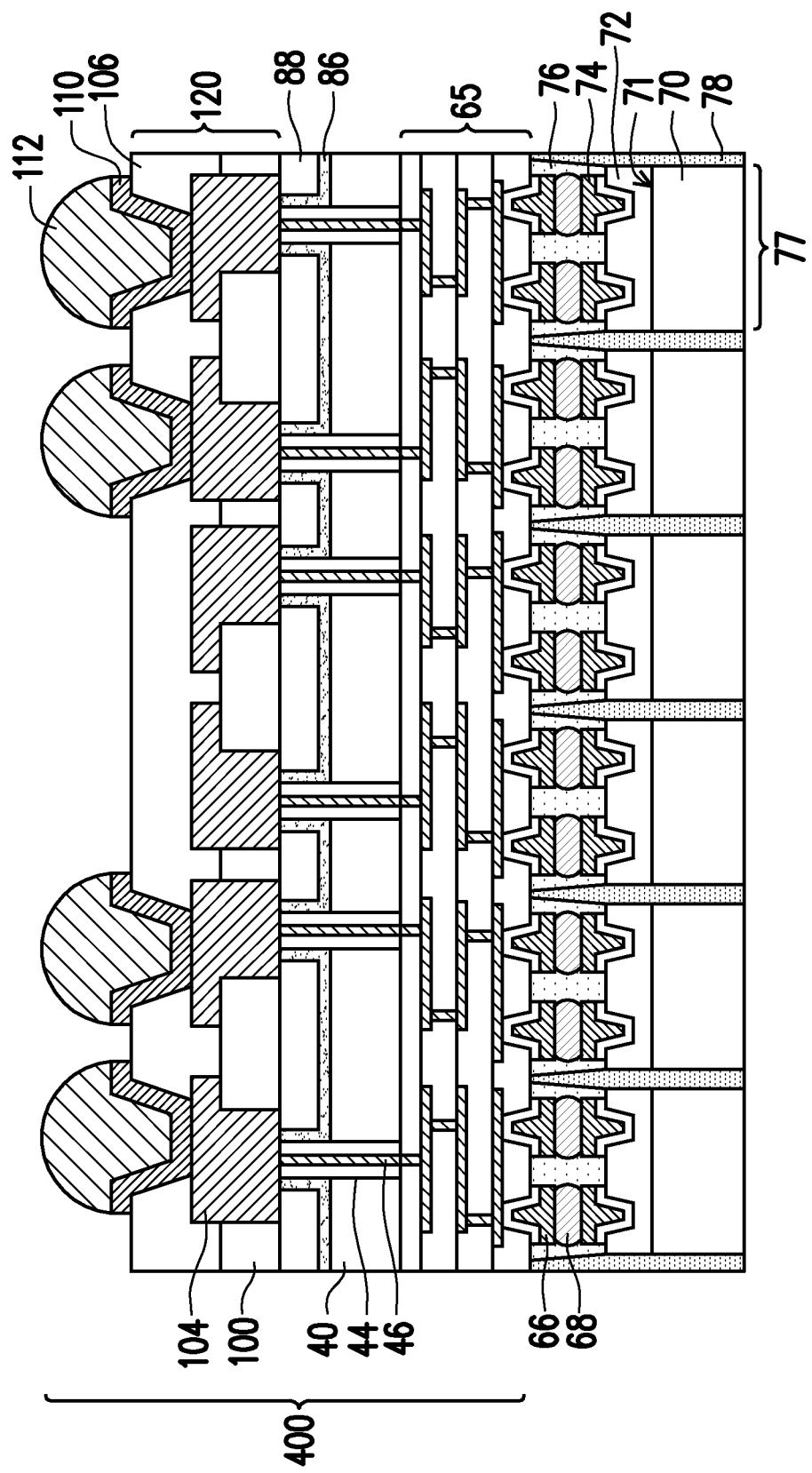

In FIG. 31, carrier substrate 82 is removed. The assembly of FIG. 31 is removed from the carrier substrate 82, for example, by exposing the adhesive 80 to UV radiation. The assembly is then diced into individual packages with an interposer and any number of dies, such as the package shown in FIG. 2.

Embodiments may achieve advantages. In some embodiments, the substrate of the interposer has a thickness in a range from 1 μm to 50 μm. Due to the thinness of the substrate, the substrate is more flexible and can reduce the stress in the package during thermal processing of the device package (e.g., reliability/stress testing, reflow/bonding to the package substrate, and the like). Further, the resistance, inductance, and capacitance of the through vias in the interposer is improved over through vias in thicker interposers. This is because the resistance, the inductance, and the capacitance of the through vias is proportional to the length of the through vias. Therefore, because the through vias of the disclosed structure are shorter than those of thicker interposers, the resistance, the inductance, and the capacitance of the disclosed structure are all improved. In some embodiments, the ratio of the thickness of the chip to the thickness of the substrate of the interposer is in a range from 10 to 50. In other words, the chip is 10 to 50 times thicker than the substrate of the interposer. In other embodiments, the ratio of the thickness of the chip to the thickness of the substrate of the interposer is smaller than 10 or larger than 50.

Various embodiments also provide a buffer structure between the interposer and the package substrate to further improve the reliability of the package and reduce the stress on the substrate of the interposer and the semiconductor chips. In some embodiments, the buffer structure may include one or more polymer layers, such as a polyimide. Further, the buffer structure may include a polymer layer with a Young's modulus in a range from 1 gigapascal (GPa) to 10 GPa. Because of the low Young's modulus value, the buffer structure is flexible and can deform with cracking or breaking.

One embodiment includes partially forming a first through via in a substrate of an interposer, the first through via extending into a first side of the substrate of the interposer. The method also includes bonding a first die to the first side of the substrate of the interposer. The method also includes recessing a second side of the substrate of the interposer to expose the first through via, the first through via protruding from the second side of the substrate of the interposer, where after the recessing, the substrate of the interposer is less than 50 μm thick. The method also includes and forming a first set of conductive bumps on the second side of the substrate of the interposer, at least one of the first set of conductive bumps being electrically coupled to the exposed first through via.

Embodiments may include one or more of the following features. The method further including forming a redistribution structure on the first side of the interposer, the redistribution structure including a plurality dielectric layers with metallization patterns therein, the metallization patterns being electrically coupled to the first through via. The method further including forming an underfill between the first die and the substrate of the interposer, and encapsulating the first die and the underfill with an encapsulant. After the recessing the second side of the substrate of the interposer, a thickness of the substrate of the interposer is in a range from 1 μm to 50 μm. After the recessing the second side of the substrate of the interposer, the first die is ten times thicker than the substrate of the interposer. The method further including after the recessing the second side of the substrate of the interposer, forming a first dielectric layer on sidewalls of the first through via and on the recessed second side of the substrate of the interposer; and forming a second dielectric layer on the first dielectric layer, the at least one of the first set of conductive bump being on the second dielectric layer. The first dielectric layer is a conformal layer and where the second dielectric layer is a non-conformal layer. The method further including forming a polymer layer over the second dielectric layer; and forming a metallization pattern in the polymer layer, the at least one of the first set of conductive bumps being on the polymer layer. After the recessing the second side of the substrate of the interposer, the first die is fifty times thicker than the substrate of the interposer. The method further including bonding a package substrate to the first set of conductive bumps, the at least one of the first set of conductive bumps being electrically coupled to the first die through the interposer.

One embodiment includes bonding a first die and a second die to an interposer, the interposer including a redistribution structure including one or more metallization patterns electrically connecting the first die to the second die. The method also includes a substrate on an opposing side of the redistribution structure as the first die and the second die. The method also includes a plurality of through substrate vias extending through the substrate, the plurality of through substrate vias being electrically coupled to the one or more metallization patterns of the redistribution structure. The method also includes forming a buffer structure on a surface of the substrate opposite the redistribution structure, the buffer structure including a polymer layer. The method also includes patterning a plurality of openings through the buffer structure, each of the plurality of openings exposing one of the plurality of through substrate vias. The method also includes forming a first metallization pattern in the plurality of openings, the first metallization pattern being electrically coupled to the plurality of through substrate vias. The method also includes and forming a plurality of first connectors on the first metallization pattern.

Embodiments may include one or more of the following features. The method where the polymer layer is a polyimide. The polymer layer has a young's modulus in a range from 1 gigapascal (gpa) to 10 gpa. The substrate of the interposer is less than 50 μm thick. The first die is ten times thicker than the substrate of the interposer. The method further including forming an underfill between the first die, the second die, and the interposer and encapsulating the first die, the second die, and the underfill with an encapsulant. After the recessing, the plurality of through vias protrude from the substrate of the interposer.

One embodiment includes a first die bonded to an interposer, the interposer including a redistribution structure including one or more metallization patterns electrically connecting the first die to the second die. The package also includes a substrate on an opposing side of the redistribution structure as the first die and the second die. The package also includes a plurality of through substrate vias extending through the substrate, the plurality of through substrate vias being electrically coupled to the one or more metallization patterns of the redistribution structure. The package also includes a buffer structure on a surface of the substrate opposite the redistribution structure, the buffer structure including a polymer layer. The package also includes a first metallization pattern in the buffer structure, the first metallization pattern being electrically coupled to the plurality of through substrate vias. The package also includes and a plurality of first connectors on and electrically coupled to the first metallization pattern.

Embodiments may include one or more of the following features. The package where the substrate of the interposer is less than 50 μm thick. The first die is ten times thicker than the substrate of the interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first through via in a substrate, the first through via extending into a first side of the substrate;
   attaching a first die to the first side of the substrate;
   recessing a second side of the substrate to expose the first through via; and
   forming a polymer layer on the second side of the substrate;
   forming a metallization pattern in the polymer layer;
   forming a first set of conductive bumps on the polymer layer, at least one of the first set of conductive bumps being electrically coupled to the metallization pattern and the exposed first through via;
   after the recessing the second side of the substrate, forming a first dielectric layer on sidewalls of the first through via and on the recessed second side of the substrate; and
   forming a second dielectric layer on the first dielectric layer, the polymer layer being on the second dielectric layer.

2. The method of claim 1 further comprising:
   forming a redistribution structure on the first side of the substrate, the redistribution structure comprising a plurality dielectric layers with metallization patterns therein, the metallization patterns being electrically coupled to the first through via.

3. The method of claim 1 further comprising:
   forming an underfill between the first die and the substrate; and
   encapsulating the first die and the underfill with an encapsulant.

4. The method of claim 1, wherein after the recessing the second side of the substrate, a thickness of the substrate is in a range from 1 μm to 50 μm.

5. The method of claim 1, wherein after the recessing the second side of the substrate, the first die is thicker than the substrate.

6. The method of claim 1 further comprising:
   forming a second polymer layer on the polymer layer, the first set of conductive bumps extending through the second polymer layer to physically contact the metallization pattern in the polymer layer.

7. The method of claim 1 further comprising:
   bonding a package substrate to the first set of conductive bumps, the at least one of the first set of conductive bumps being electrically coupled to the first die.

8. The method of claim 1, wherein the polymer layer has a Young's modulus in a range from 1 gigapascal (GPa) to 10 GPa.

9. A structure comprising:
   a first die and a second die bonded to a first side of a substrate;
   a plurality of through substrate vias extending through the substrate, the plurality of through substrate vias being electrically coupled to the first die and the second die;
   a buffer structure on a surface of the substrate opposite the first die and the second die, the buffer structure comprising multiple polymer layers;
   a first metallization pattern in the buffer structure, the first metallization pattern being electrically coupled to and physically contacting the plurality of through substrate vias;
   a plurality of first connectors on and electrically coupled to the first metallization pattern, the plurality of first connectors electrically coupled to and physically contacting the first metallization pattern; and
   a first dielectric layer and a second dielectric layer between the substrate and the buffer structure, the first dielectric layer being on sidewalls of the plurality of through substrate vias and on the substrate, the second dielectric layer being on the first dielectric layer.

10. The structure of claim 9 further comprising:
    a redistribution structure on the first side of the substrate, the redistribution structure comprising one or more metallization patterns electrically coupled to the first die to the second die.

11. The structure of claim 10, wherein the plurality of through substrate vias are electrically coupled to the redistribution structure.

12. The structure of claim 9, wherein the substrate is less than 50 μm thick.

13. The structure of claim 9, wherein the first die is thicker than the substrate.

14. The structure of claim 9 further comprising:
    an underfill between the first die and the second die and the substrate; and an encapsulant on sidewalls of the first die, the second die, and the underfill.

15. The structure of claim 9, wherein the first dielectric layer is a conformal layer and wherein the second dielectric layer is a non-conformal layer.

16. A method comprising:
bonding a first die and a second die to substrate, the substrate having a plurality of through substrate vias extending through the substrate, the plurality of through substrate vias being electrically coupled to at least one of the first die and the second die;
forming a polymer layer on a surface of the substrate opposite the first die and the second die;
forming a plurality of openings through the polymer layer, each of the plurality of openings exposing one of the plurality of through substrate vias;
forming a first metallization pattern in the plurality of openings, the first metallization pattern being electrically coupled to the plurality of through substrate vias; and
forming a plurality of first connectors on the first metallization pattern.

17. The method of claim 16, wherein the substrate is less than 50 µm thick.

18. The method of claim 16 further comprising:
forming an underfill between the first die, the second die, and the substrate; and
encapsulating the first die, the second die, and the underfill with an encapsulant.

19. The method of claim 16 further comprising:
recessing the surface of the substrate opposite the first die and the second die, wherein after the recessing, the plurality of through vias protrude from the substrate.

20. The method of claim 19 further comprising:
after the recessing the surface of the substrate opposite the first die and the second die, forming a first dielectric layer on sidewalls of the plurality of through vias and on the recessed surface of the substrate; and
forming a second dielectric layer on the first dielectric layer, the polymer layer being on the second dielectric layer.

* * * * *